(12) United States Patent
Park et al.

(10) Patent No.: US 12,396,253 B2
(45) Date of Patent: Aug. 19, 2025

(54) INTEGRATED CIRCUIT DEVICES INCLUDING STACKED FIELD EFFECT TRANSISTORS AND METHODS OF FORMING THE SAME

(71) Applicant: Samsung Electronics Co., Ltd., Suwon-si (KR)

(72) Inventors: Keumseok Park, Slingerlands, NY (US); Sooyoung Park, Halfmoon, NY (US); Jaejik Baek, Watervliet, NY (US); Kang-Ill Seo, Springfield, VA (US)

(73) Assignee: Samsung Electronics Co., Ltd. (KR)

( * ) Notice: Subject to any disclaimer, the term of this patent is extended or adjusted under 35 U.S.C. 154(b) by 401 days.

(21) Appl. No.: 18/171,754

(22) Filed: Feb. 21, 2023

(65) Prior Publication Data

US 2024/0136354 A1    Apr. 25, 2024

Related U.S. Application Data

(60) Provisional application No. 63/380,127, filed on Oct. 19, 2022.

(51) Int. Cl.
*H01L 27/088* (2006.01)
*H01L 21/8234* (2006.01)
(Continued)

(52) U.S. Cl.
CPC ....... *H10D 84/834* (2025.01); *H10D 30/6757* (2025.01); *H10D 62/121* (2025.01);
(Continued)

(58) Field of Classification Search
CPC ............ H10D 84/834; H10D 30/6757; H10D 62/121; H10D 62/151; H10D 84/0128; H10D 84/013; H10D 84/038; H10D 30/014; H10D 30/43; H10D 30/6735; H10D 64/251; H10D 84/83; H10D 88/00; H10D 84/0149; H10D 88/01; H10D 84/0167; H10D 84/017; H10D 84/856; H10D 84/853; B82Y 10/00
(Continued)

(56) References Cited

U.S. PATENT DOCUMENTS 11,158,634 B1    10/2021   Huang et al.
11,289,606 B2     3/2022   Ju et al.
(Continued)

OTHER PUBLICATIONS

"Extended European Search Report dated Mar. 15, 2024, issued in corresponding European Application No. 23203815.8, pp. 13".

*Primary Examiner* — Tong-Ho Kim
(74) *Attorney, Agent, or Firm* — Myers Bigel, P.A.

(57) ABSTRACT

Integrated circuit devices and methods of forming the same are provided. An integrated circuit device may include a substrate and a transistor stack on the substrate, the transistor stack including a first transistor and a second transistor on the first transistor. The first transistor may be between the substrate and the second transistor and the first transistor may include first and second source/drain regions, a first channel region between the first and second source/drain regions, and a first gate structure on the first channel region. A lower surface of the first source/drain region may be higher than a lower surface of the first gate structure relative to the substrate.

19 Claims, 25 Drawing Sheets

(51) Int. Cl.
  *H01L 29/06*   (2006.01)
  *H01L 29/08*   (2006.01)
  *H01L 29/786*  (2006.01)
  *H10D 30/67*   (2025.01)
  *H10D 62/10*   (2025.01)
  *H10D 62/13*   (2025.01)
  *H10D 84/01*   (2025.01)
  *H10D 84/03*   (2025.01)
  *H10D 84/83*   (2025.01)

(52) U.S. Cl.
  CPC ....... *H10D 62/151* (2025.01); *H10D 84/0128* (2025.01); *H10D 84/013* (2025.01); *H10D 84/038* (2025.01)

(58) Field of Classification Search
  USPC ........................................ 257/288
  See application file for complete search history.

(56) References Cited

U.S. PATENT DOCUMENTS

| | | |
|---|---|---|
| 11,349,004 B2 | 5/2022 | Yu et al. |
| 2019/0229201 A1 | 7/2019 | Wu et al. |
| 2020/0295198 A1* | 9/2020 | Cheng ................ H10D 30/6757 |
| 2021/0035975 A1 | 2/2021 | Kim et al. |
| 2021/0336019 A1 | 10/2021 | Su et al. |
| 2021/0351079 A1 | 11/2021 | Su et al. |
| 2021/0375665 A1 | 12/2021 | Cheng et al. |
| 2021/0376076 A1 | 12/2021 | Su et al. |
| 2021/0407997 A1* | 12/2021 | Thomas ............. H10D 30/6729 |
| 2022/0037497 A1* | 2/2022 | Chung ................ H10D 62/116 |
| 2022/0102552 A1 | 3/2022 | Fulford et al. |

\* cited by examiner

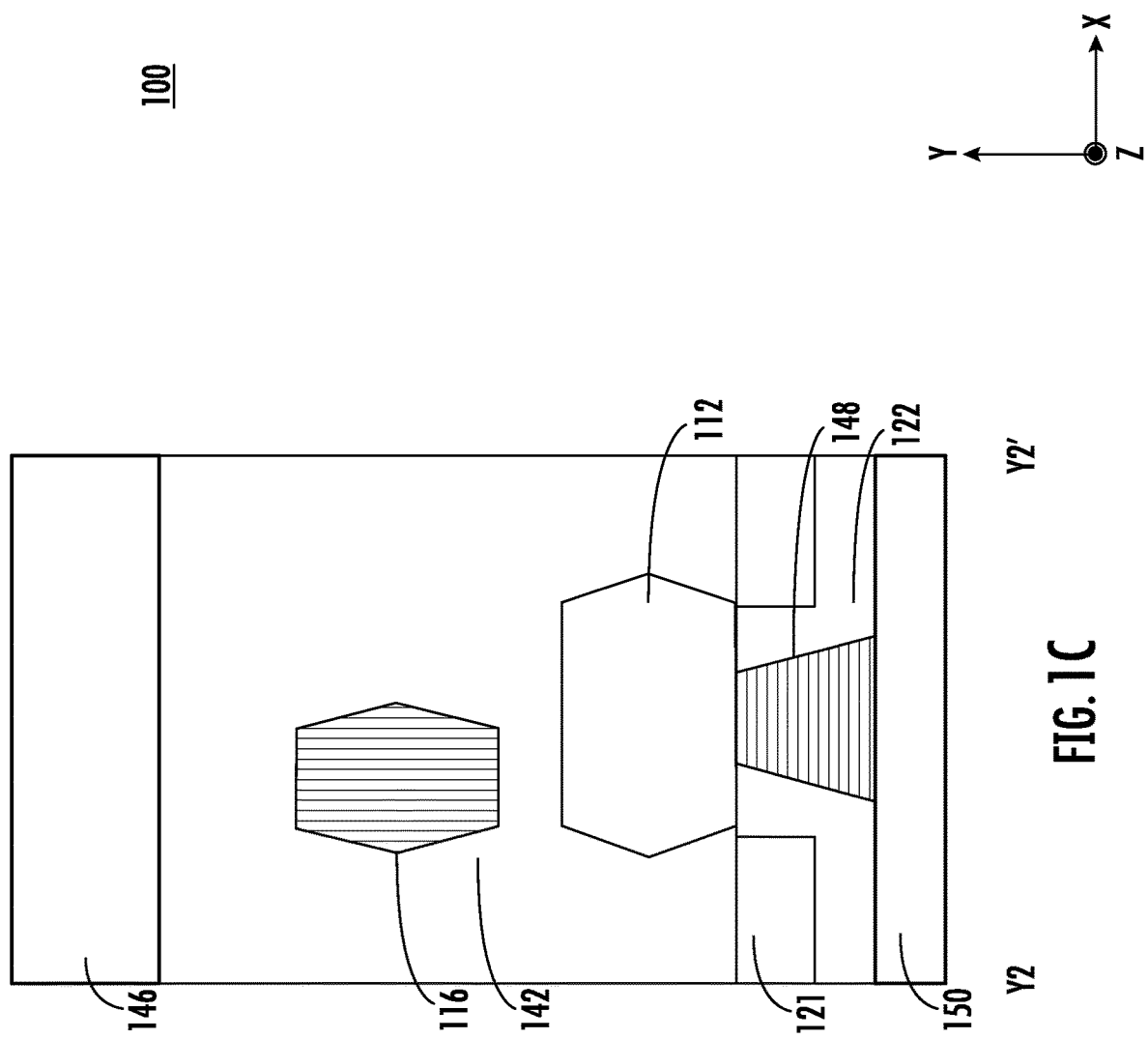

US 12,396,253 B2

INTEGRATED CIRCUIT DEVICES INCLUDING STACKED FIELD EFFECT TRANSISTORS AND METHODS OF FORMING THE SAME

CROSS-REFERENCE TO RELATED APPLICATION

This application claims priority to U.S. Provisional Application Ser. No. 63/380,127 entitled METHODS OF FORMING STACKED FIELD EFFECT TRANSISTOR, filed in the USPTO on Oct. 19, 2022, the disclosure of which is hereby incorporated by reference herein in its entirety.

BACKGROUND

The present disclosure generally relates to the field of integrated circuit devices and, more particularly, to integrated circuit devices including stacked field effect transistors (FETs).

Various structures of integrated circuit devices and methods of forming the same have been proposed to increase the integration density and/or improve the performance of the integrated circuit devices. Specifically, integrated circuit devices including 3D-stacked FETs have been proposed.

SUMMARY

An integrated circuit device according to some embodiments may include a substrate and a transistor stack on the substrate, the transistor stack including a first transistor and a second transistor on the first transistor. The first transistor may be between the substrate and the second transistor and the first transistor may include first and second source/drain regions, a first channel region between the first and second source/drain regions, and a first gate structure on the first channel region. A lower surface of the first source/drain region may be higher than a lower surface of the first gate structure relative to the substrate.

An integrated circuit device according to some embodiments may include a substrate and a transistor stack on the substrate, the transistor stack including a first transistor and a second transistor on the first transistor. The first transistor may be between the substrate and the second transistor and may include first and second source/drain regions, a first channel region between the first and second source/drain regions, and a first gate structure on the first channel region. An uppermost end of the second source/drain region may be spaced apart from the substrate by a first distance, and an upper surface of the first gate structure may be spaced apart from the substrate by a second distance that is equal to or greater than the first distance.

A method of forming an integrated circuit device according to some embodiments may include forming a preliminary transistor stack on a substrate, the preliminary transistor stack including an upper channel region and a lower channel region that is between the substrate and the upper channel region, forming a bottom insulating layer on the substrate and adjacent a first side surface of the lower channel region, and forming a first source/drain region on the bottom insulating layer, the first source/drain region contacting the first side surface of the lower channel region.

BRIEF DESCRIPTION OF THE DRAWINGS

FIG. 1C shows a cross-sectional view of an integrated circuit device taken along the line Y2-Y2' in FIG. 1 according to some embodiments.

DETAILED DESCRIPTION

A parasitic capacitance between a gate electrode and a source/drain region can deteriorate the performance (e.g., the AC performance) of an integrated circuit device, and that parasitic capacitance can be changed by various factors. For example, that parasitic capacitance may increase as a portion of the gate electrode overlapping with the source/drain region increases. According to some embodiments, an integrated circuit device may include a gate electrode including a portion that does not overlap with a source/drain region such that a parasitic capacitance between the gate electrode and the source/drain region can be reduced. In some embodiments, an insulating layer (e.g., a bottom insulating layer) may be formed under a source/drain region and may overlap a lower portion of a gate electrode so that the lower portion of the gate electrode may not overlap the source/drain region. In this case, a thickness of the source/drain region may be reduced in a lower portion due to the insulating layer, and a source/drain contact (e.g., a top contact) may be connected to an upper surface of the source/drain region. In some other embodiments, an insulating layer (e.g., a top insulating layer) may be formed above a source/drain region and may overlap an upper portion of a gate electrode so that the upper portion of the gate electrode does not overlap the source/drain region. In this case, a thickness of the source/drain region may be reduced in an upper portion due to the insulating layer, and a source/drain contact (e.g., a bottom contact) may be connected to a lower surface of the source/drain region.

Example embodiments will be described in greater detail with reference to the attached figures.

Figure 1:
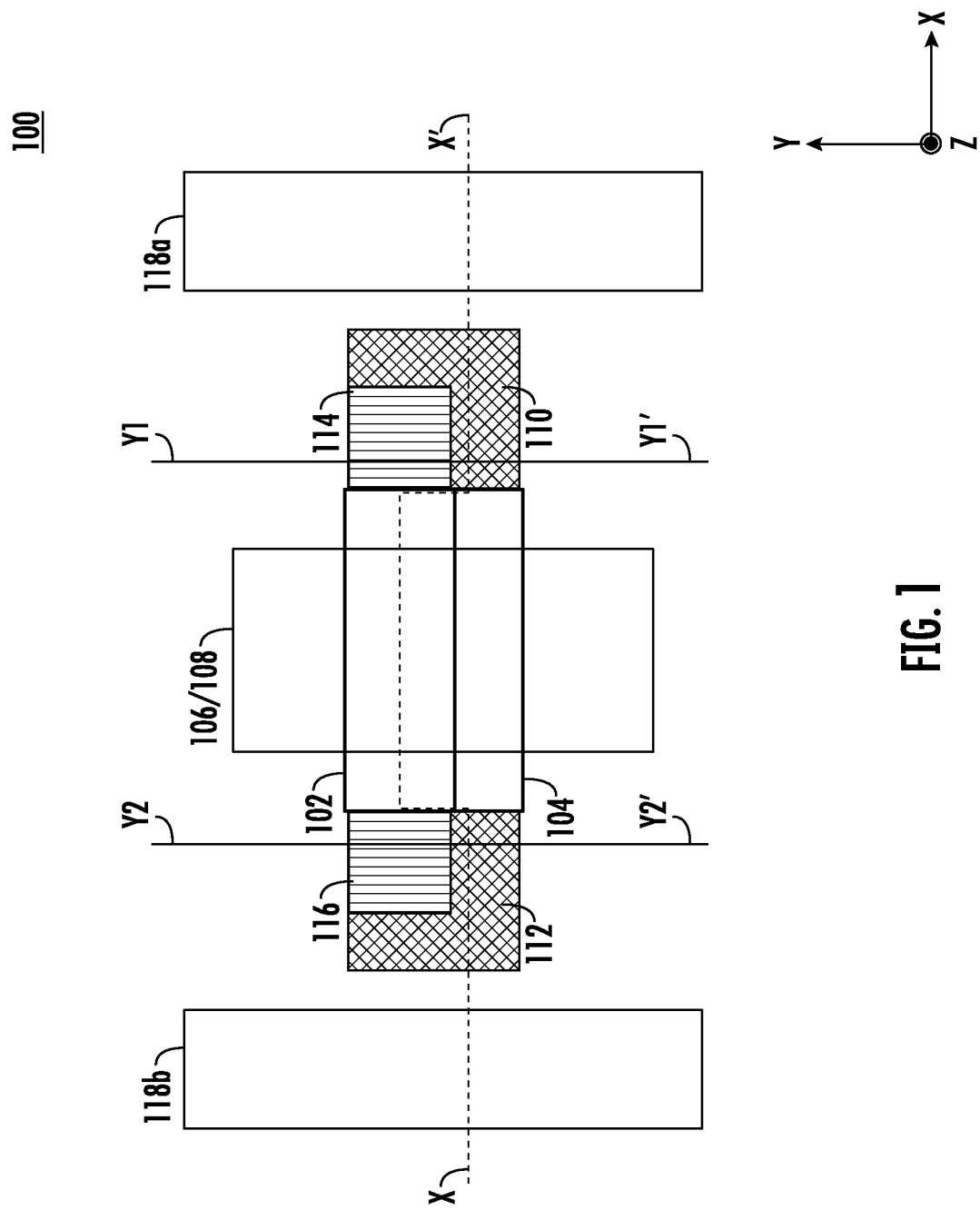
FIG. 1 is a layout of an integrated circuit device according to some embodiments.
Figure 1A:
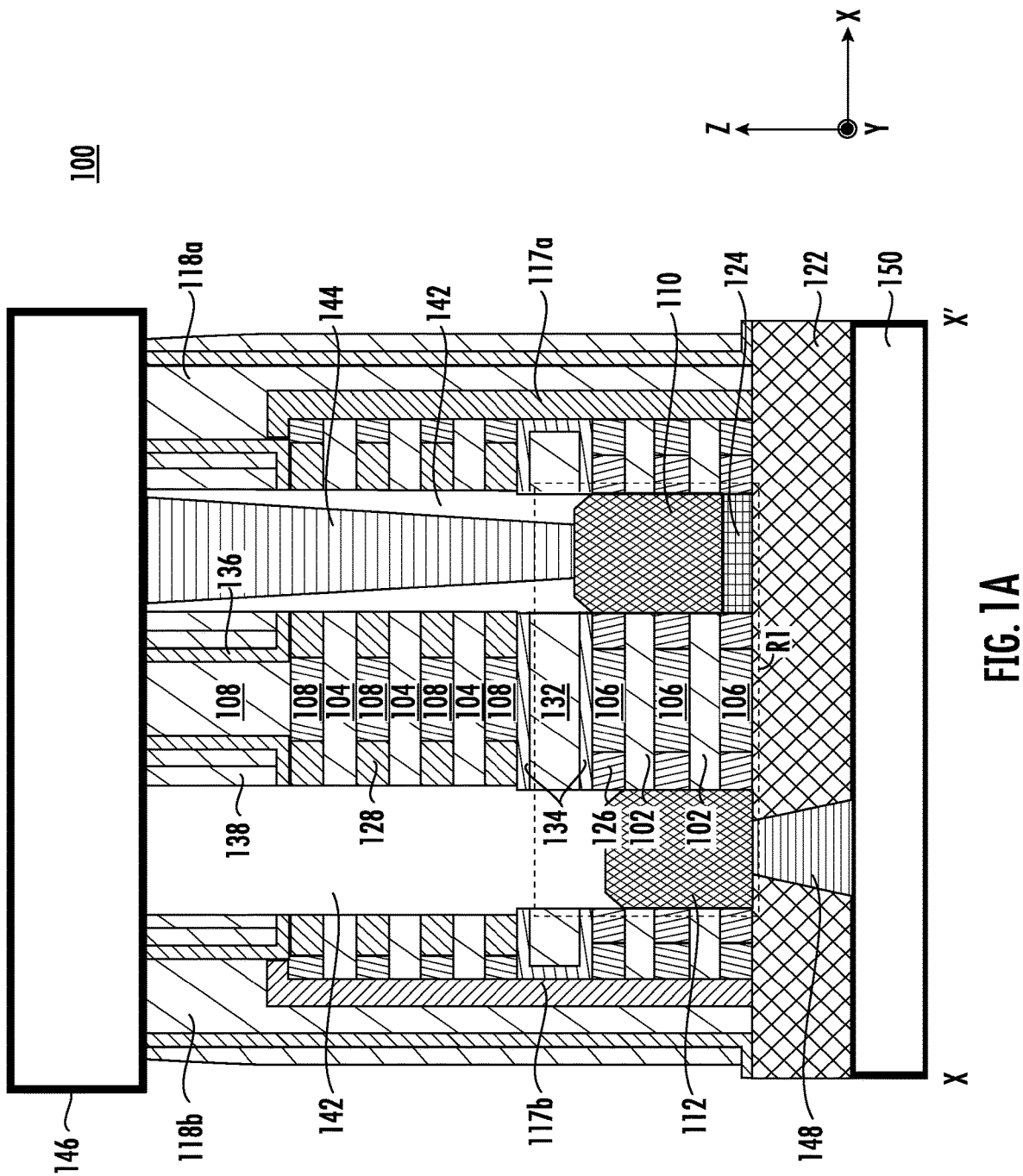
FIG. 1A shows a cross-sectional view of an integrated circuit device taken along the line X-X' in FIG. 1 according to some embodiments.
Figure 1B:
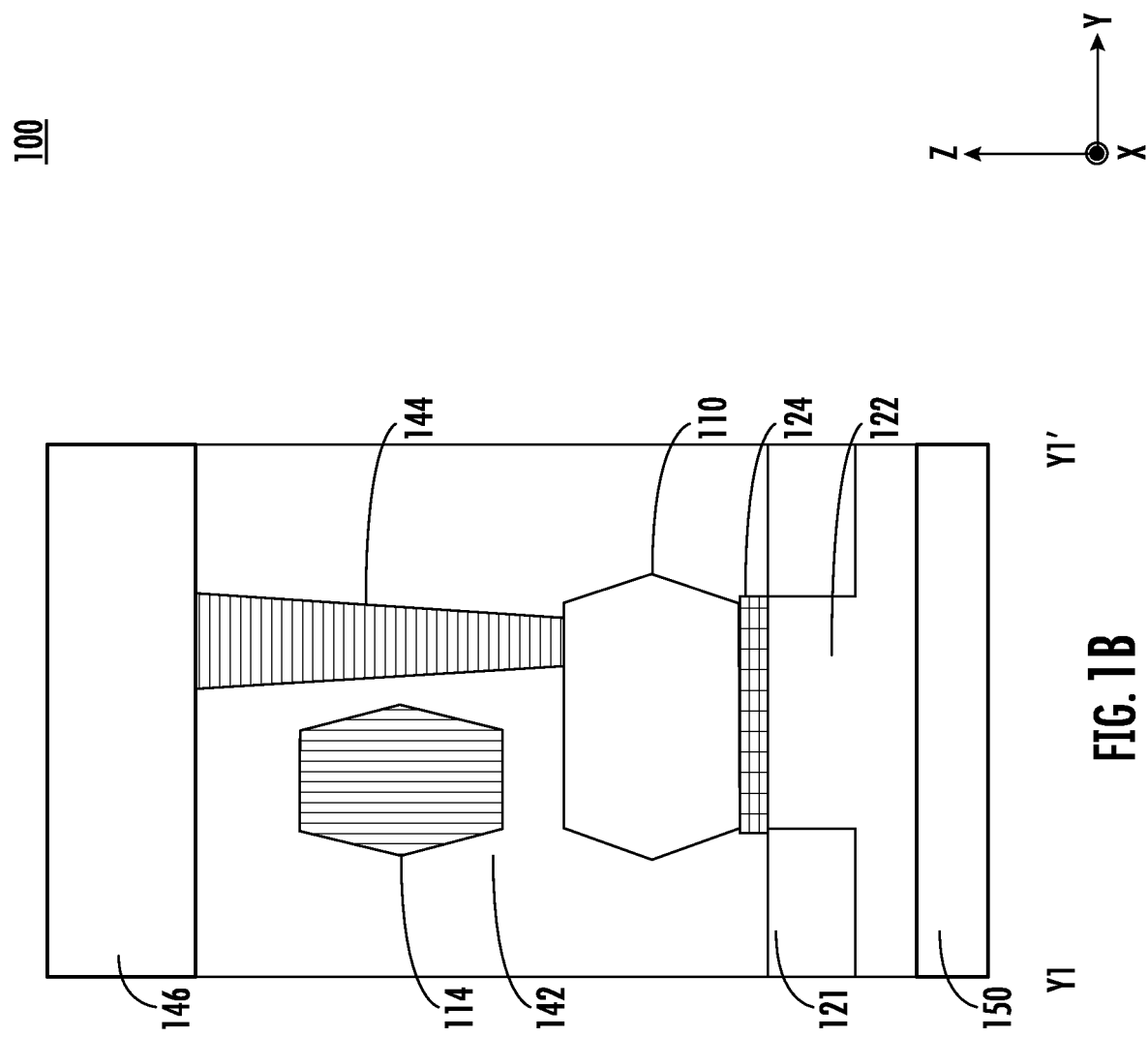
FIG. 1B shows a cross-sectional view of an integrated circuit device taken along the line Y1-Y1' in FIG. 1 according to some embodiments.

FIG. 1 is a layout of a first integrated circuit device 100 according to some embodiments. For simplicity of illustration, FIG. 1 shows only selected elements. FIG. 1A shows a cross-sectional view of the first integrated circuit device 100 taken along the line X-X' in FIG. 1, according to some embodiments. FIG. 1B shows a cross-sectional view of the first integrated circuit device 100 taken along the line Y1-Y1' in FIG. 1 according to some embodiments. FIG. 1C shows a cross-sectional view of the first integrated circuit device 100 taken along the line Y2-Y2' in FIG. 1 according to some embodiments. Referring to FIGS. 1, 1A, 1B, and 1C, the first integrated circuit device 100 may include first and second lower source/drain regions 110 and 112 on a substrate 122, and first and second upper source/drain regions 114 and 116 on the first and second lower source/drain regions 110 and 112. The first and second lower source/drain regions 110 and 112 may be between, in a third direction Z (also referred to as a vertical direction), the first and second upper source/drain regions 114 and 116 and the substrate 122. The first integrated circuit device 100 may also include a lower channel region 102, an upper channel region 104, a lower gate structure 106, an upper gate structure 108, and first and second dummy gate structures 118a and 118b. As used herein, a lower element/surface refers to the element/surface closer than an upper element/surface to the substrate 122.

The first and second lower source/drain regions 110 and 112, the lower channel region 102, and the lower gate structure 106 may form a lower transistor (e.g., a first transistor). The first and second upper source/drain regions 114 and 116, the upper channel region 104, and the upper gate structure 108 may form an upper transistor (e.g., a second transistor). The lower transistor and the upper transistor may comprise a transistor stack of the first integrated circuit device 100. The substrate 122 and the upper transistor may be spaced apart from each other in the third direction Z with the lower transistor therebetween. In some embodiments, the lower transistor and the upper transistor may be different types of metal-oxide semiconductor field-effect transistors (MOSFETs), but are not limited thereto. For example, the lower transistor may be a PMOS transistor of the transistor stack, and the upper transistor may be an NMOS transistor of the transistor stack, or vice versa, depending on the specifications of the first integrated circuit device 100. In some embodiments, the lower and upper transistors may be formed as a complementary metal-oxide-semiconductor (CMOS) structure. The lower and upper transistors may be stacked in the third direction Z on the substrate 122.

The first and second dummy gate structures 118a and 118b may be gate structures that do not function electrically (e.g., non-active gate structures) and may be formed to replicate a physical structure of the lower and upper gate structures 106 and 108. The first and second dummy gate structures 118a and 118b may be connected to various elements. For example, the first and second dummy gate structures 118a and 118b may be connected to first and second dummy gate spacers 117a and 117b of the first integrated circuit device 100.

In some embodiments, the substrate 122 may extend in a first direction X (also referred to as a first horizontal direction) and a second direction Y (also referred to as a second horizontal direction). In some embodiments, the first direction X may be perpendicular to the second direction Y. The substrate 122 may include one or more semiconductor materials, for example, Si, Ge, SiGe, GaP, GaAs, SiC, SiGeC and/or InP. In some embodiments, the substrate 122 may be a bulk substrate (e.g., a bulk silicon substrate) or a semiconductor on insulator (SOI) substrate. For example, the substrate 122 may be a silicon wafer. A thickness of the substrate 122 in the third direction Z may be in a range of 50 nm to 100 nm. In some embodiments, the substrate 122 may include insulating material(s), for example, silicon oxide, silicon oxynitride, silicon nitride, silicon carbonitride and/or a low-k material. For example, the substrate 122 may include multiple insulating layers (e.g., a silicon oxide layer and a silicon nitride layer) stacked in the third direction Z. In some embodiments, the third direction Z may be perpendicular to the first direction X and/or the second direction Y.

The lower channel region 102 may be, for example, a semiconductor layer having a nano-scale thickness in the third direction Z. The lower channel region 102 may be between, in the first horizontal direction X, the first and second lower source/drain regions 110 and 112. The first and second lower source/drain regions 110 and 112 may be electrically connected to the lower channel region 102. In some embodiments, a plurality of lower channel regions 102 may be stacked in the third direction Z, and the lower channel regions 102 may be spaced apart from each other in the third direction Z, as illustrated in FIG. 1A. For example, the lower channel region 102 may be implemented by, for example, multiple nanosheets or nanowires that extend between the first and second lower source/drain regions 110 and 112. In some other embodiments, the lower channel region 102 may be a single channel region.

The lower gate structure 106 may include a lower gate insulator and a lower gate electrode. The lower channel region 102 may extend through the lower gate structure 106 in the first direction X, and the lower gate insulator may be provided between the lower gate electrode and the lower channel region 102 for electrical isolation therebetween. The lower gate insulator may contact the lower channel region 102. In some embodiments, the lower gate electrode may include a metallic layer that includes, for example, tungsten (W), aluminum (Al), copper (Cu), molybdenum (Mo) and/or ruthenium (Ru). The lower gate electrode may additionally include work function layer(s) (e.g., a TiN layer, a TaN layer, a TiAl layer, a TiC layer, a TiAlC layer, a TiAlN layer and/or a WN layer). The work function layer(s) may be provided between the metallic layer and the lower gate insulator. In some embodiments, the work function layer(s) may separate the metallic layer from the lower gate insulator.

The first and second lower source/drain regions 110 and 112 may be spaced apart from each other in the first direction X, and the lower gate structure 106 may be provided between the first and second lower source/drain regions 110 and 112.

The upper channel region 104 may be, for example, a semiconductor layer having a nano-scale thickness in the third direction Z. The upper channel region 104 may be between, in the first horizontal direction X, the first and second upper source/drain regions 114 and 116. The first and second upper source/drain regions 114 and 116 may be electrically connected to the upper channel region 104. In some embodiments, a plurality of upper channel regions 104 may be stacked in the third direction Z, and the upper channel regions 104 may be spaced apart from each other in the third direction Z, as illustrated in FIG. 1A. For example, the upper channel region 104 may be implemented by, for example, multiple nanosheets or nanowires that extend between the first and second upper source/drain regions 114 and 116. In some other embodiments, the upper channel region 104 may be a single channel region.

The upper gate structure 108 may include an upper gate insulator and an upper gate electrode. The upper channel region 104 may extend through the upper gate structure 108 in the first direction X, and the upper gate insulator may be provided between the upper gate electrode and the upper channel region 104 for electrical isolation therebetween. The upper gate insulator may contact the upper channel region 104. In some embodiments, the upper gate electrode may include a metallic layer that includes, for example, tungsten (W), aluminum (Al), copper (Cu), molybdenum (Mo) and/or ruthenium (Ru). The upper gate electrode may additionally include work function layer(s) (e.g., a TiN layer, a TaN layer, a TiAl layer, a TiC layer, a TiAlC layer, a TiAlN layer and/or a WN layer). The work function layer(s) may be provided between the metallic layer and the upper gate insulator. In some embodiments, the work function layer(s) may separate the metallic layer from the upper gate insulator.

The first integrated circuit device 100 may also include a first gate isolation layer 132 that is provided between the lower gate structure 106 and the upper gate structure 108. In some embodiments, the first gate isolation layer 132 may completely separate the lower gate structure 106 from the upper gate structure 108, and the lower gate structure 106 may not contact the upper gate structure 108. For example, the first gate isolation layer 132 may be an insulating layer. In other embodiments, the first gate isolation layer 132 may be omitted.

The first and second upper source/drain regions 114 and 116 may be spaced apart from each other in the first direction X, and the upper gate structure 108 may be provided between the first and second upper source/drain regions 114 and 116. In some embodiments, the first lower source/drain region 110 and the first upper source/drain region 114 may overlap each other in the third direction Z, and the second lower source/drain region 112 and the second upper source/drain region 116 may overlap each other in the third direction Z, as illustrated in FIGS. 1, 1B, and 1C. As used herein, "an element A overlapping an element B in a direction X" (or similar language) means that there is at least one line that extends in the direction X and intersects both the elements A and B.

Though the first and second lower source/drain regions 110 and 112 are shown in FIG. 1A as being single-layer source/drain regions, in some embodiments, they may include multiple semiconductor layers. Similarly, although the first and second upper source/drain regions 114 and 116 are shown in FIGS. 1B and 1C, respectively, as being single-layer source/drain regions, in some embodiments, they may include multiple semiconductor layers. Accordingly, the first and second lower source/drain regions 110 and 112 and the first and second upper source/drain regions 114 and 116 may be either single-layer or multi-layer source/drain regions.

Each of the lower channel region 102 and the upper channel region 104 may include semiconductor material(s) (e.g., Si, Ge, SiGe, GaP, GaAs, SiC, SiGeC and/or InP). In some embodiments, the lower channel region 102 and the upper channel region 104 may include the same material(s). In some embodiments, each of the lower channel region 102 and the upper channel region 104 may be a nanosheet that may have a thickness in a range of from 1 nm to 100 nm in the third direction Z or may be a nanowire that may have a circular cross-section with a diameter in a range of from 1 nm to 100 nm.

Each of the lower and upper gate insulators may include a single layer or multiple layers (e.g., a silicon oxide layer and/or a high-k material layer). For example, the high-k material layer may include $Al_2O_3$, $HfO_2$, $ZrO_2$, $HfZrO_4$, $TiO_2$, $Sc_2O_3$ $Y_2O_3$, $La_2O_3$, $Lu_2O_3$, $Nb_2O_5$ and/or $Ta_2O_5$. In some embodiments, the lower and upper gate insulators may include the same material(s). In some embodiments, the lower and upper gate electrodes may include the same material(s).

In some embodiments, the first and second lower source/drain regions 110 and 112 may include the same material(s) as that of the first and second upper source/drain regions 114 and 116. The first and second lower source/drain regions 110 and 112 and the first and second upper source/drain regions 114 and 116 may include one or more semiconductor materials such as Si, Ge, SiGe, GaP, GaAs, SiC, SiGeC and/or InP. In other embodiments, the first and second upper source/drain regions 114 and 116 may include a different semiconductor material from that of the first and second lower source/drain regions 110 and 112. For example, the first and second upper source/drain regions 114 and 116 may include silicon germanium, and the first and second lower source/drain regions 110 and 112 may include silicon carbide, or vice versa.

The first integrated circuit device 100 may include an insulating layer 142 in which the first and second lower source/drain regions 110 and 112 and the first and second upper source/drain regions 114 and 116 are provided.

The first integrated circuit device 100 may include an upper gate spacer 128 (also referred to as an inner gate spacer). For simplicity of illustration, the cross-sectional view of FIG. 1A is not taken along a line intersecting the first and second upper source/drain regions 114 and 116. It will be understood, however, that the upper gate spacer 128 may be provided between the upper gate structure 108 and the first and second upper source/drain regions 114 and 116 for electrical isolation therebetween. A lower gate spacer 126 may be provided between the lower gate structure 106 and the first and second lower source/drain regions 110 and 112 for electrical isolation therebetween. In some embodiments, opposing side surfaces of the upper gate spacer 128 may respectively contact the upper gate structure 108 and one of the first and second upper source/drain regions 114 and 116, and opposing side surfaces of the lower gate spacer 126 may respectively contact the lower gate structure 106 and one of the first and second lower source/drain regions 110 and 112.

In some embodiments, the upper channel region 104 may extend through the upper gate spacer 128 in the first direction X and may contact the first and second upper source/drain regions 114 and 116. The lower channel region 102 may extend through the lower gate spacer 126 in the first direction X and may contact the first and second lower source/drain regions 110 and 112, as illustrated in FIGS. 1 and 1A. The lower and upper gate spacers 126 and 128 may include, for example, silicon oxide, silicon oxynitride, silicon nitride, silicon carbonitride and/or a low-k material. For example, the low-k material may include fluorine-doped silicon oxide, organosilicate glass, carbon-doped oxide, porous silicon dioxide, porous organosilicate glass, spin-on organic polymeric dielectrics and/or spin-on silicon based polymeric dielectric.

In some embodiments, a second gate isolation layer 134 may be between an upper surface of the first gate isolation layer 132 and the upper gate structure 108, and/or between a lower surface of the first gate isolation layer 132 and the lower gate structure 106.

Second spacers 138 may be on sidewalls of an upper portion of the upper gate structure 108, and first spacers 136 may be between the second spacers 138 and the upper portion of the upper gate structure 108.

The first and second gate isolation layers 132 and 134, the insulating layer 142, and/or the first and second spacers 136 and 138 may comprise, for example, silicon oxide, silicon oxynitride, silicon nitride, or a low-k dielectric material.

A bottom insulating layer 124 may be formed between the substrate 122 and a lower surface of the first lower source/drain region 110. The bottom insulating layer 124 may comprise, for example, silicon oxide, silicon oxynitride, silicon nitride, or a low-k dielectric material.

A top contact 144 may be provided in the insulating layer 142 on the first lower source/drain region 110. The top contact 144 may electrically connect the first lower source/drain region 110 to a conductive element (e.g., a conductive wire or a conductive via plug) of a back-end-of-line (BEOL) structure 146 that is formed through the BEOL portion of device fabrication. In some embodiments, the top contact 144 may contact the first lower source/drain region 110 (e.g., may contact an upper surface of the first lower source/drain region 110).

The BEOL structure 146 may include conductive wires (e.g., metal wires) stacked in the third direction Z, and conductive via plugs (e.g., metal via plugs), each of which may electrically connect two conductive wires that are spaced apart from each other in the third direction Z.

A bottom contact 148 may be provided in the substrate 122. In some embodiments, the bottom contact 148 may extend through the substrate 122 in the third direction Z, and the bottom contact 148 may contact the second lower source/drain region 112 (e.g., may contact a lower surface of the second lower source/drain region 112), as illustrated in FIG. 1A. In some embodiments, a width of the bottom contact 148 in a horizontal direction (e.g., the first direction X or the second direction Y) may increase with increasing distance from the second lower source/drain region 112 in the third direction Z, as illustrated in FIG. 1A. The bottom contact 148 may include a conductive layer that may include metal element(s) (e.g., W, Al, Cu, Mo and/or Ru).

The bottom contact 148 may electrically connect the second lower source/drain region 112 to a conductive element (e.g., a conductive wire or a conductive via plug) of a back side power distribution network (BSPDN) structure 150. In some embodiments, the second lower source/drain region 112 may be electrically connected to a power source with a predetermined voltage (e.g., a drain voltage or a source voltage). The BSPDN structure 150 may include multiple insulating layers stacked on a lower surface of the substrate 122 and conductive elements provided in the insulating layers.

Referring to FIGS. 1B and 1C, a shallow trench isolation (STI) 121 may be formed in the substrate 122 and adjacent side surfaces of the first and second lower source/drain regions 110 and 112. The STI 121 may electrically insulate transistors of the first integrated circuit device 100 from one another. A portion of the substrate 122 between the STI 121 (e.g., a portion of the substrate 122 that the first and second lower source/drain regions 110 and 112 are formed on) may be referred to as an active region of the first integrated circuit device 100.

Figure 1D:
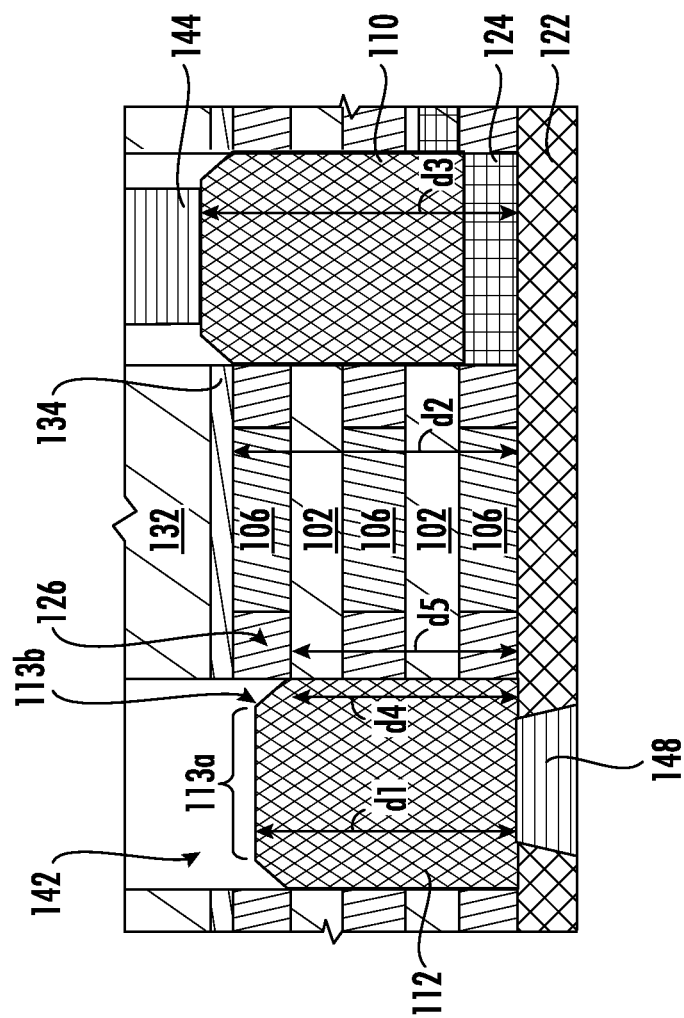
FIG. 1D is an enlarged view of the region R1 in FIG. 1A according to some embodiments.

FIG. 1D is an enlarged view of the region R1 in FIG. 1A according to some embodiments. Referring to FIG. 1D, the bottom insulating layer 124 may be formed between a lower surface of the first lower source/drain region 110 and the substrate 122. An upper surface of the bottom insulating layer 124 may contact the lower surface of the first lower source/drain region 110. The first lower source/drain region 110 may be formed such that an upper surface of the first lower source/drain region 110 is at a height, relative to the substrate 122, to be electrically connected to the top contact 144. The top contact 144 may contact the upper surface of the first lower source/drain region 110. By forming the first lower source/drain region 110 on the bottom insulating layer 124, the first lower source/drain region 110 may have a reduced thickness in the third direction Z.

The lower surface of the first lower source/drain region 110 may be higher than a lower surface of the lower gate structure 106, relative to the substrate 122. The lower surface of the lower gate structure 106 may be coplanar with a lower surface of the bottom insulating layer 124. In some embodiments, the lower surface of the first lower source/drain region 110 may be coplanar with a lower surface of a lowermost lower channel region 102 of a plurality of lower channel regions 102 (e.g., may be coplanar with a lower surface of the lower channel region 102). A lower portion of the lower gate structure 106 may be between the substrate 122 and the lowermost lower channel region 102 of the plurality of lower channel regions 102. In some embodiments, the lower portion of the lower gate structure 106 may be partially overlapped by the first lower source/drain region 110, in the first direction X. In other embodiments, the entire lower portion of the lower gate structure 106 may not be overlapped by the first lower source/drain region 110, in the first direction X. The bottom insulating layer 124 may partially or entirely overlap the lower portion of the lower gate structure 106 in the first direction X, which may reduce a parasitic capacitance between the first lower source/drain region 110 and the lower gate structure 106. In some embodiments, as used herein, "a surface A is coplanar with a surface B" (or similar language) means that the surfaces A and B are equidistant from the substrate 122.

Accordingly, a parasitic capacitance between the first lower source/drain region 110 and the lower gate structure 106 may be reduced by forming the first lower source/drain region 110 with a reduced thickness (e.g., a reduced thickness in the third direction Z). The thickness of the first lower source/drain region 110 may be reduced in a lower portion thereof by forming the first lower source/drain region 110 on the bottom insulating layer 124.

The second lower source/drain region 112 may have a reduced thickness (e.g., a reduced thickness in the third direction Z) at an upper portion thereof. For example, an upper surface of the first lower source/drain region 110 and/or an upper surface of the lower gate structure 106 may be higher than an upper surface of the second lower source/drain region 112, relative to the substrate 122. The lower surface of the first lower source/drain region 110 may be higher than a lower surface of the second lower source/drain region 112, relative to the substrate 122. The second lower source/drain region 112 may be formed such that the lower surface of the second lower source/drain region 112 is on the substrate 122 and contacts the bottom contact 148. The bottom contact 148 may be in the substrate 122 and may be electrically connected to the second lower source/drain region 112. An upper portion of the lower gate structure 106 may be between the upper gate structure 108 (or the first gate isolation layer 132 and/or the second gate isolation layer 134) and an uppermost lower channel region 102 of the plurality of lower channel regions 102. In some embodiments, the upper portion of the lower gate structure 106 may be partially or entirely overlapped by a portion of the insulating layer 142 formed on the second lower source/drain region 112, in the first direction X.

Accordingly, a parasitic capacitance between the second lower source/drain region 112 and the lower gate structure 106 may be reduced by forming the second lower source/drain region 112 with a reduced thickness (e.g., a reduced thickness in the third direction Z). The thickness of the second lower source/drain region 112 may be reduced in an upper portion thereof.

In some embodiments, the upper surface of the second lower source/drain region 112 may have a flat portion 113a and a sloped portion 113b. The flat portion 113a may be coplanar with or lower than an upper surface of the lower gate structure 106. In some embodiments, the sloped portion 113b may extend between a lower surface of an uppermost one of the lower gate spacers 126 and the flat portion 113a. In other embodiments, the sloped portion 113b may extend between a sidewall of the uppermost one of the lower gate spacers 126 and the flat portion 113a. An uppermost end (e.g., the flat portion 113a) of the second lower source/drain region 112 may be spaced apart from the substrate 122 by a first distance d1. The upper surface of the lower gate structure 106 may be spaced apart from the substrate 122 by a second distance d2. In some embodiments, the second distance d2 may be equal to the first distance d1. In other embodiments, the second distance d2 may be greater than the first distance d1, as shown in FIG. 1D. An uppermost end of the first lower source/drain region 110 may be spaced apart from the substrate 122 by a third distance d3 that is greater than the first distance d1. A lowermost end of the upper surface of the second lower source/drain region 112 may be spaced apart from the substrate 122 by a fourth distance d4, and an upper surface of the uppermost lower channel region 102 of the plurality of lower channel regions 102 (e.g., an upper surface of the lower channel region 102) may be spaced apart from the substrate 122 by a fifth distance d5 that may be equal to the fourth distance d4 in some embodiments.

In FIG. 1D, the first lower source/drain region 110 may be electrically connected to the top contact 144, and the second lower source/drain region 112 may be electrically connected to the bottom contact 148. The first lower source/drain region 110 may be formed on the bottom insulating layer 124 and may have a reduced thickness at a lower portion thereof. The second lower source/drain region 112 may have a reduced thickness at an upper portion thereof. Accordingly, the first and second lower source/drain regions 110 and 112 may each have a reduced parasitic capacitance with respect to the lower gate structure 106.

Figure 2:
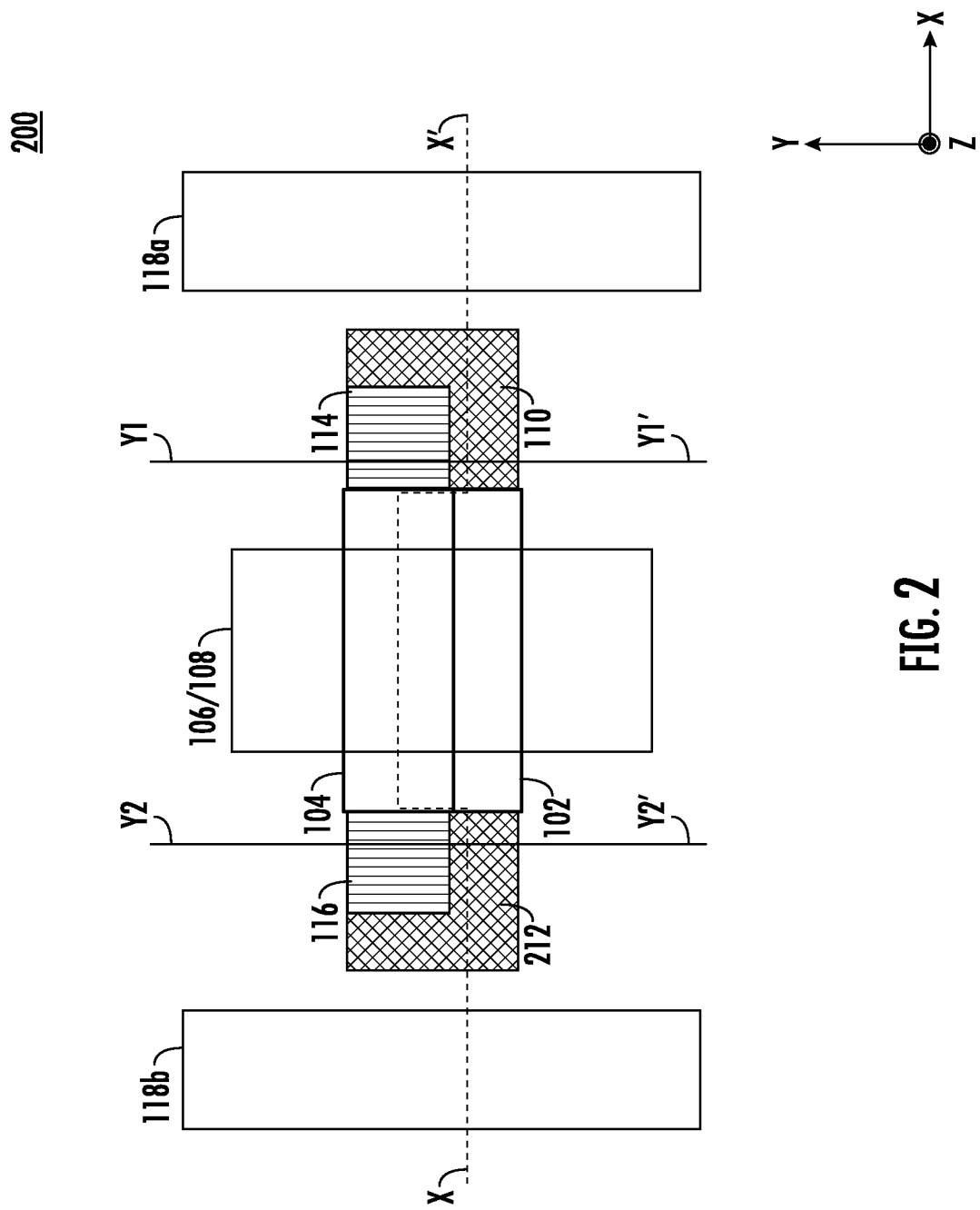
FIG. 2 is a layout of an integrated circuit device according to some embodiments.
Figure 2A:
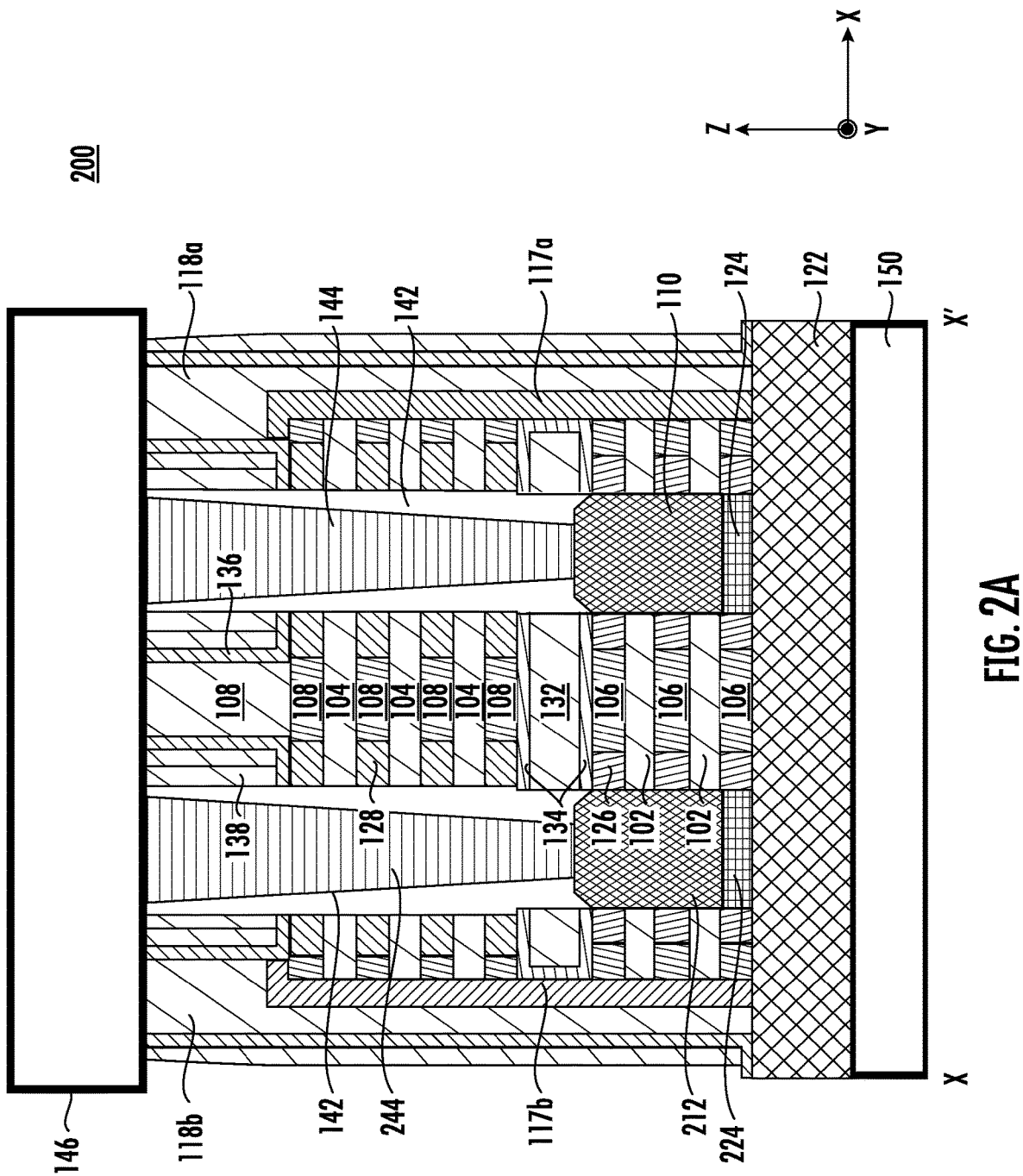
FIG. 2A shows a cross-sectional view of an integrated circuit device taken along the line X-X' in FIG. 2 according to some embodiments.
Figure 2B:
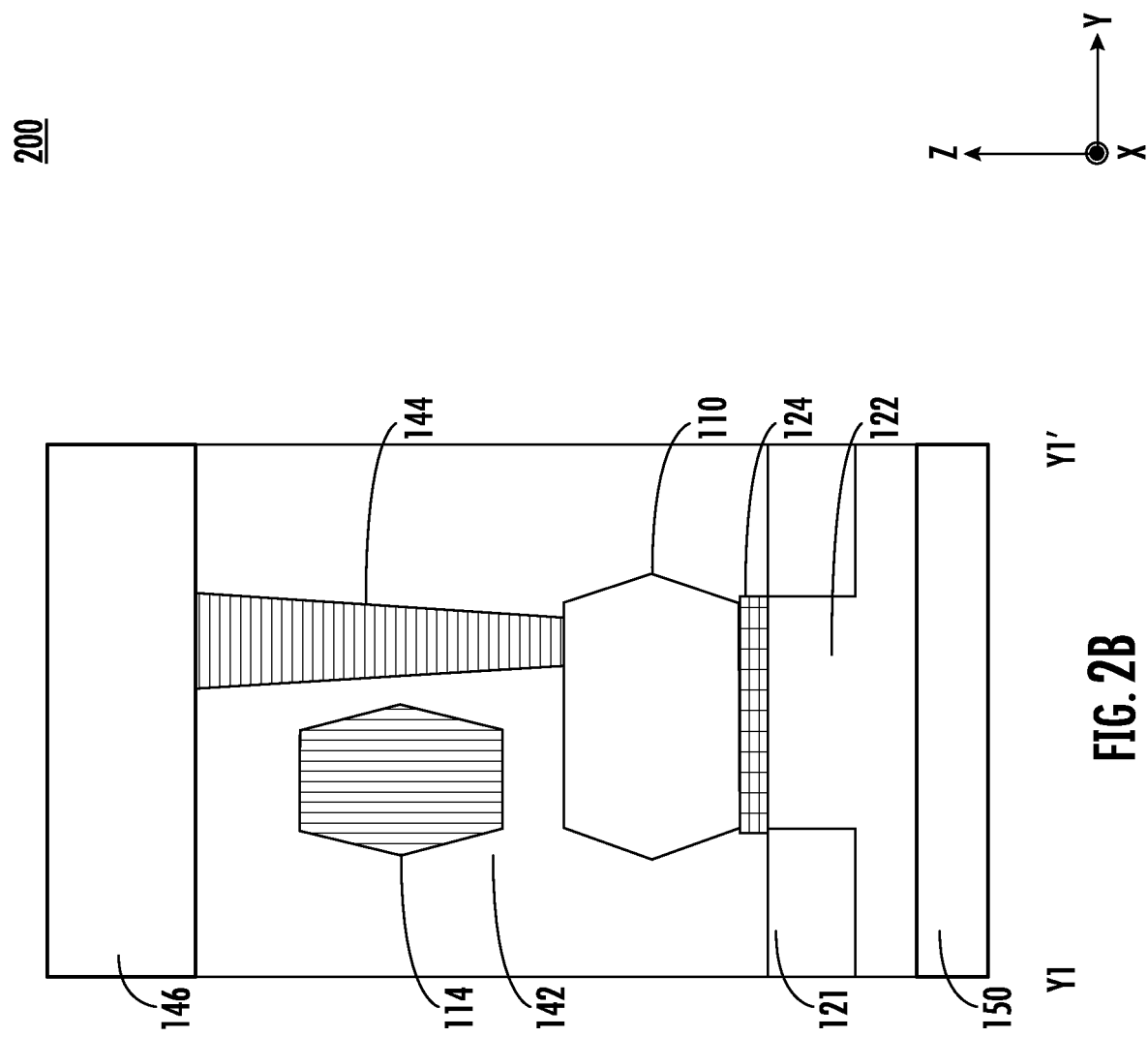
FIG. 2B shows a cross-sectional view of an integrated circuit device taken along the line Y1-Y1' in FIG. 2 according to some embodiments.
Figure 2C:
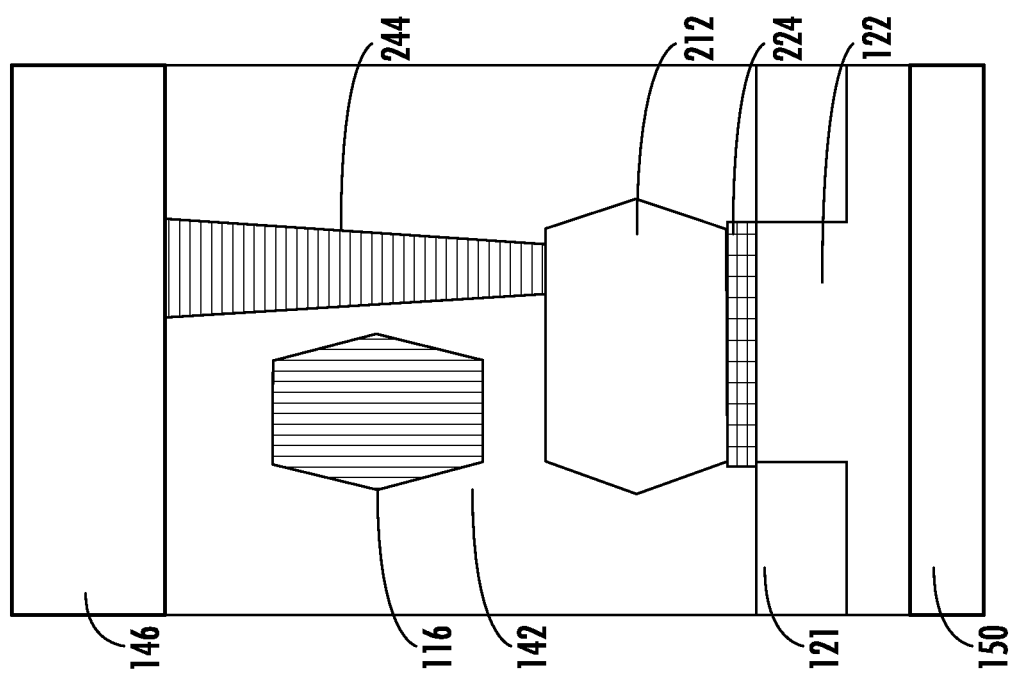
FIG. 2C shows a cross-sectional view of an integrated circuit device taken along the line Y2-Y2' in FIG. 2 according to some embodiments.

FIG. 2 is a layout of a second integrated circuit device 200 according to some embodiments. FIG. 2A shows a cross-sectional view of the second integrated circuit device 200 taken along the line X-X' in FIG. 2 according to some embodiments. FIG. 2B shows a cross-sectional view of the second integrated circuit device 200 taken along the line Y1-Y1' in FIG. 2 according to some embodiments. FIG. 2C shows a cross-sectional view of the second integrated circuit device 200 taken along the line Y2-Y2' in FIG. 2 according to some embodiments. Referring to FIGS. 2, 2A, 2B, and 2C, the second integrated circuit device 200 is similar to the first integrated circuit device 100 with a primary difference being that the second integrated circuit device 200 includes a second lower source/drain region 212 that is on a second bottom insulating layer 224 and is electrically connected to a second top contact 244. A lower surface of the second lower source/drain region 212 may be higher than a lower surface of the lower gate structure 106, relative to the substrate 122. The second lower source/drain region 212 may be similar to the first lower source/drain region 110 and, as such, further description will be omitted. The second bottom insulating layer 224 may be similar to the bottom insulating layer 124 (e.g., a first bottom insulating layer 124) except that the second bottom insulating layer 224 is between the lower surface of the second lower source/drain region 212 and the substrate 122. The second top contact 244 may be similar to the top contact 144 (e.g., a first top contact 144) except that the second top contact 244 may contact an upper surface of the second lower source/drain region 212 and be electrically connected thereto.

The first and second lower source/drain regions 110 and 212 may be electrically connected to the first and second top contacts 144 and 244, respectively. The first and second lower source/drain regions 110 and 212 may be formed on the first and second bottom insulating layers 124 and 224, respectively, and may each have a reduced thickness at a lower portion thereof. Accordingly, the first and second lower source/drain regions 110 and 212 may each have a reduced parasitic capacitance with respect to the lower gate structure 106.

Figure 3:
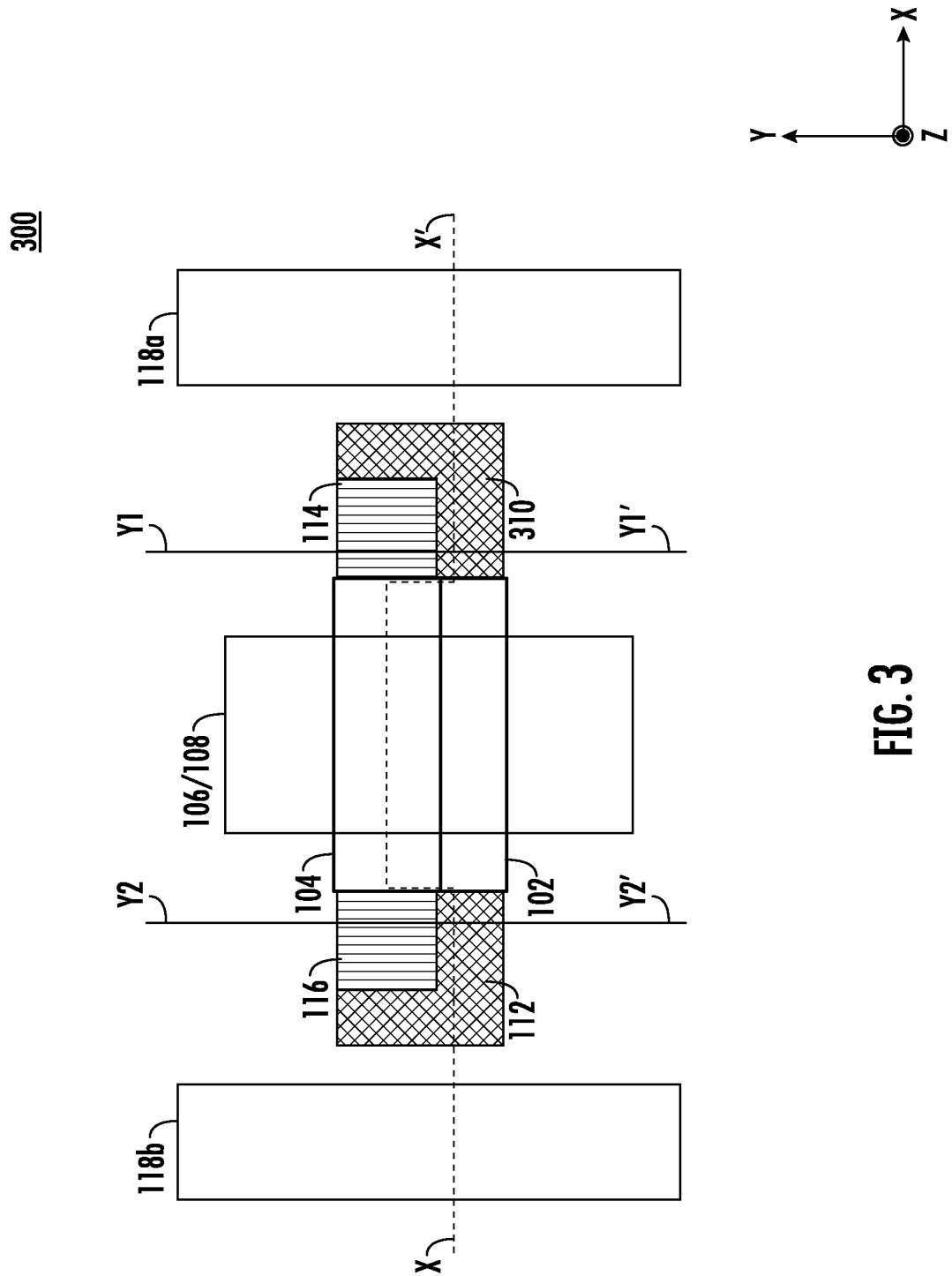
FIG. 3 is a layout of an integrated circuit device according to some embodiments.
Figure 3A:
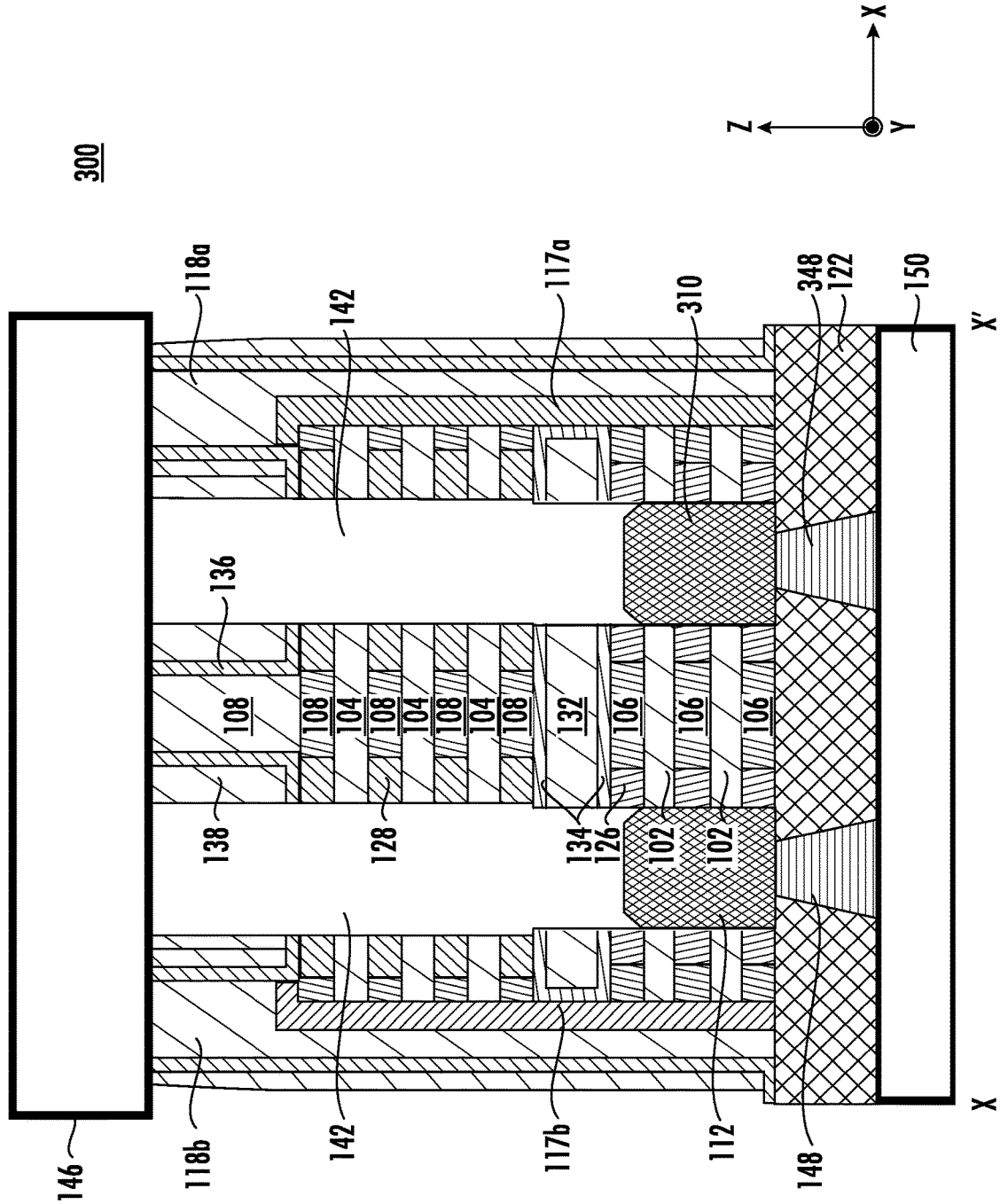
FIG. 3A shows a cross-sectional view of an integrated circuit device taken along the line X-X' in FIG. 3 according to some embodiments.
Figure 3B:
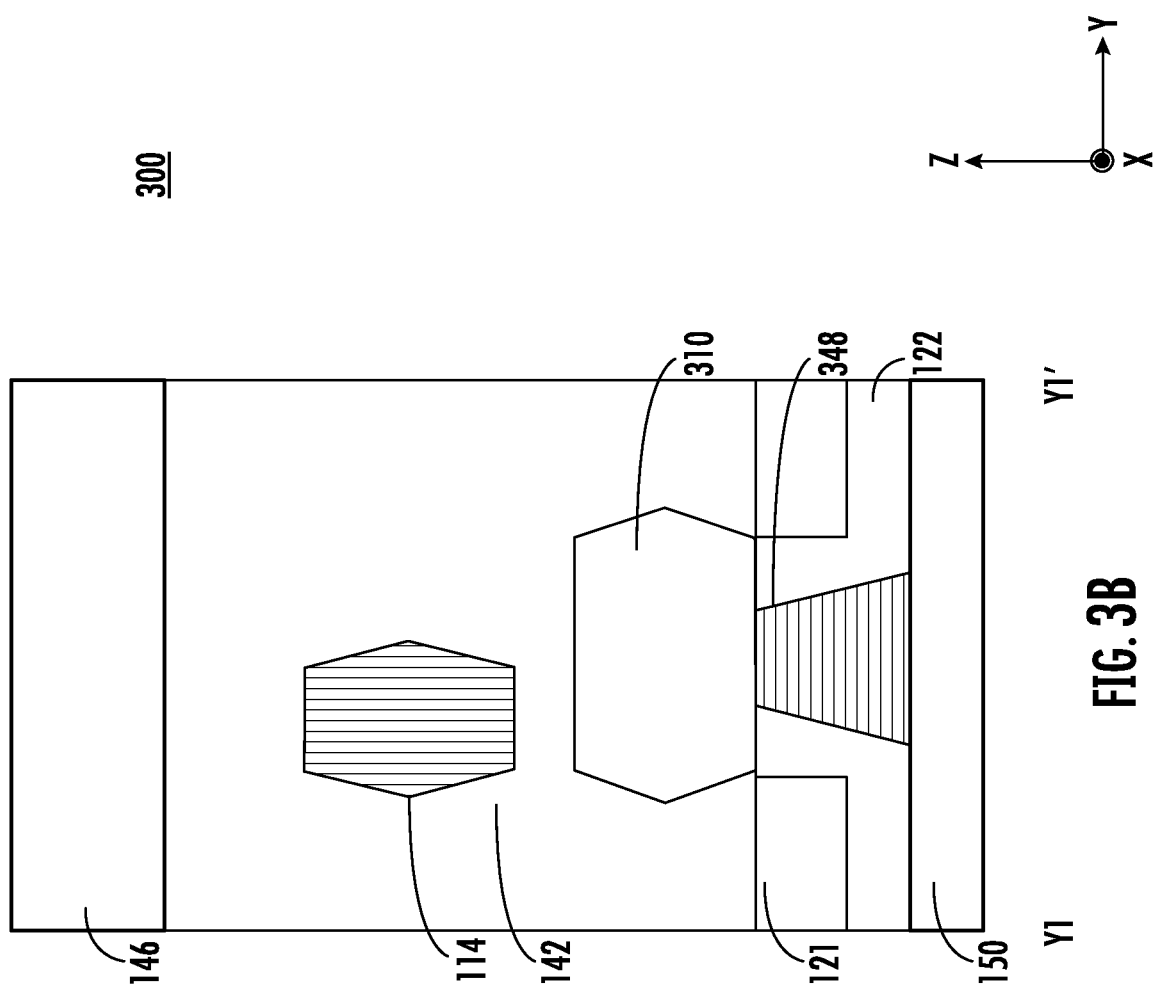
FIG. 3B shows a cross-sectional view of an integrated circuit device taken along the line Y1-Y1' in FIG. 3 according to some embodiments.
Figure 3C:
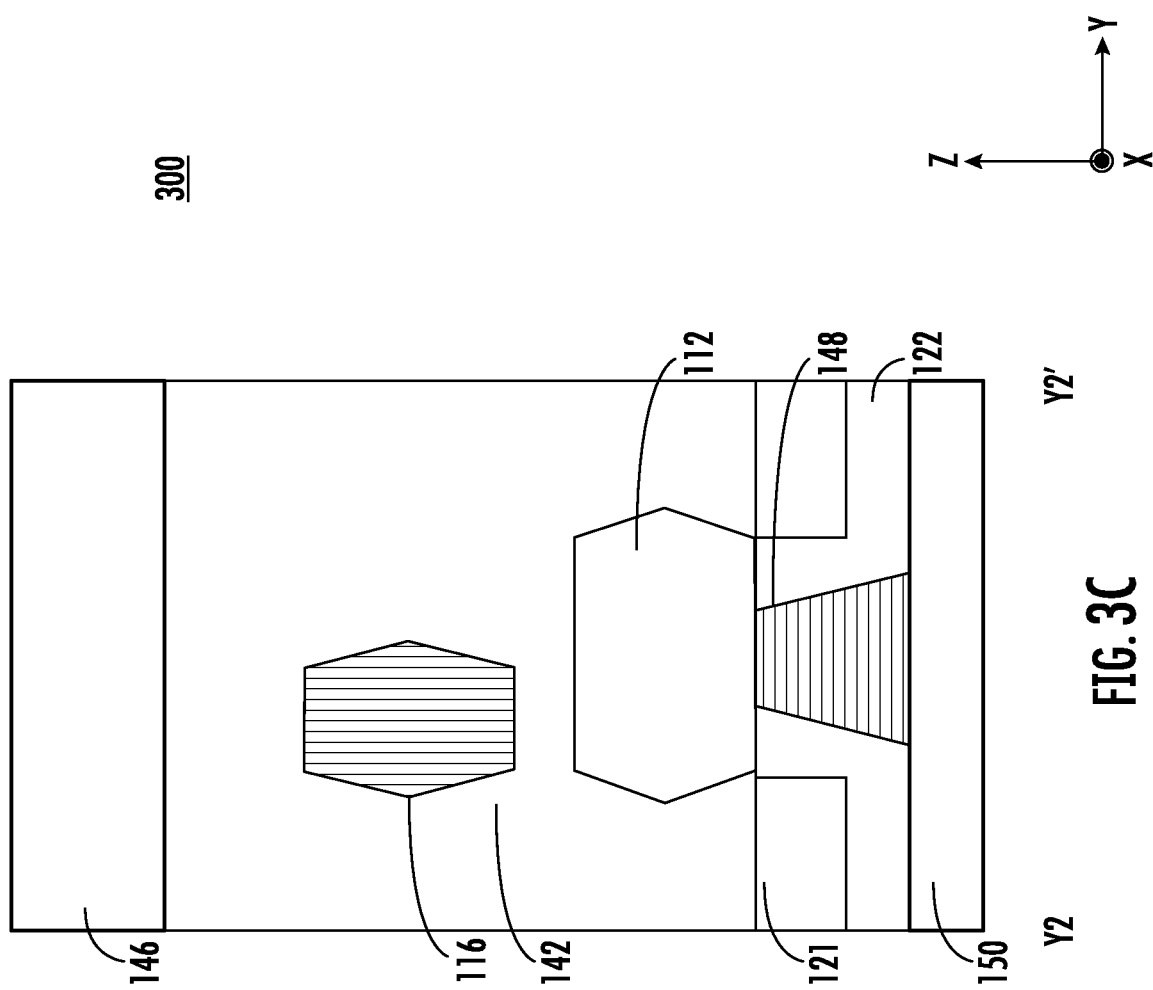
FIG. 3C shows a cross-sectional view of an integrated circuit device taken along the line Y2-Y2' in FIG. 3 according to some embodiments.

FIG. 3 is a layout of a third integrated circuit device 300 according to some embodiments. FIG. 3A shows a cross-sectional view of the third integrated circuit device 300 taken along the line X-X' in FIG. 3 according to some embodiments. FIG. 3B shows a cross-sectional view of the third integrated circuit device 300 taken along the line Y1-Y1' in FIG. 3 according to some embodiments. FIG. 3C shows a cross-sectional view of the third integrated circuit device 300 taken along the line Y2-Y2' in FIG. 3 according to some embodiments. Referring to FIGS. 3, 3A, 3B, and 3C, the third integrated circuit device 300 is similar to the first integrated circuit device 100 with a primary difference being that the third integrated circuit device 300 includes a first lower source/drain region 310 that is electrically connected to a first bottom contact 348. The first lower source/drain region 310 may be similar to the second lower source/drain region 112 and, as such, further description will be omitted. The first bottom contact 348 may be similar to the bottom contact 148 (e.g., a second bottom contact 148) except that the first bottom contact 348 may contact the first lower source/drain region 310 (e.g., may contact a lower surface of the first lower source/drain region 310) and be electrically connected thereto.

The first and second lower source/drain regions 310 and 112 may be electrically connected to the first and second bottom contacts 348 and 148, respectively. The first and second lower source/drain regions 310 and 112 may each have a reduced thickness at an upper portion thereof. Accordingly, the first and second lower source/drain regions 310 and 112 may each have a reduced parasitic capacitance with respect to the lower gate structure 106.

Figure 4:
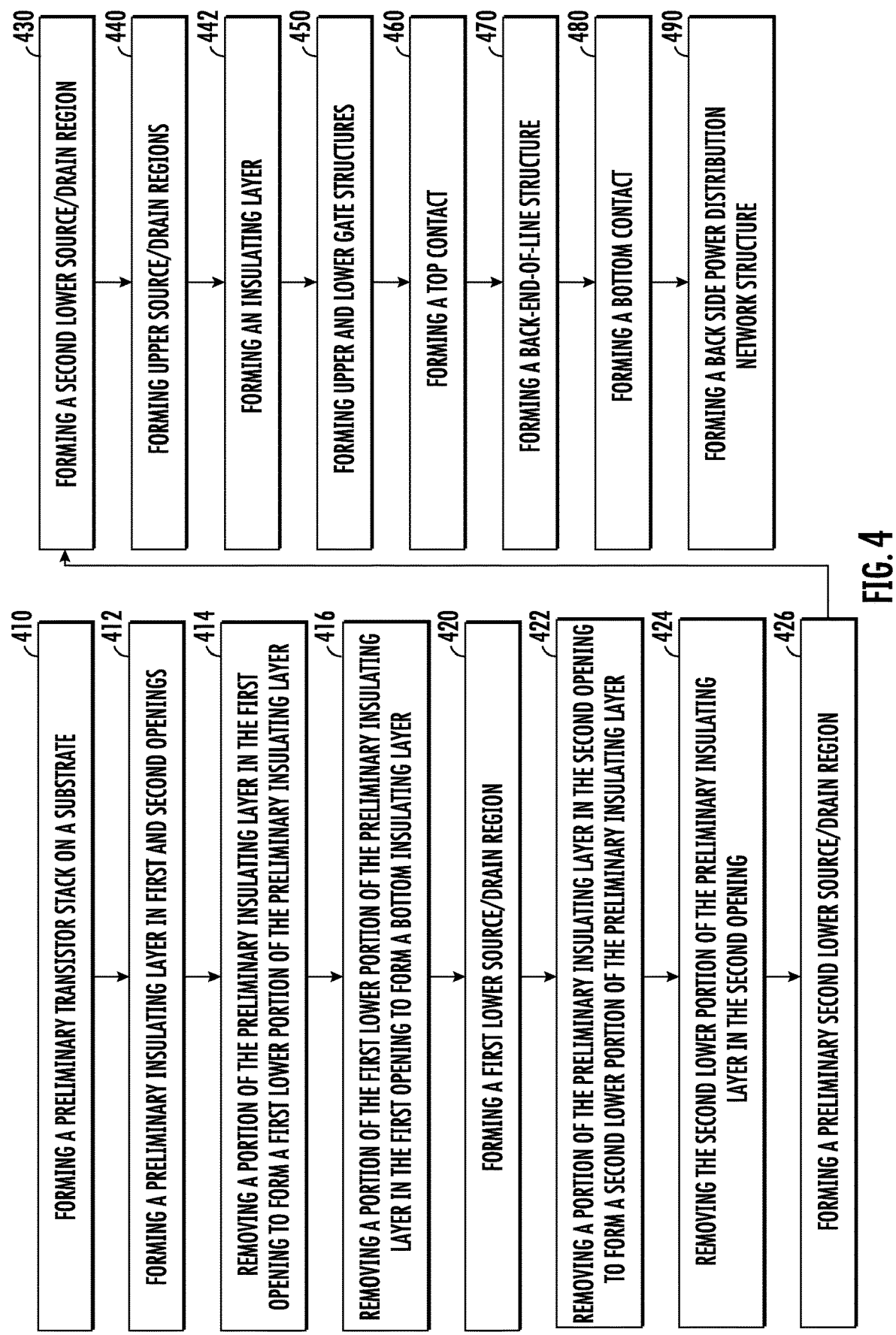
FIG. 4 is a flow chart of methods of forming an integrated circuit device according to some embodiments.
Figure 5:
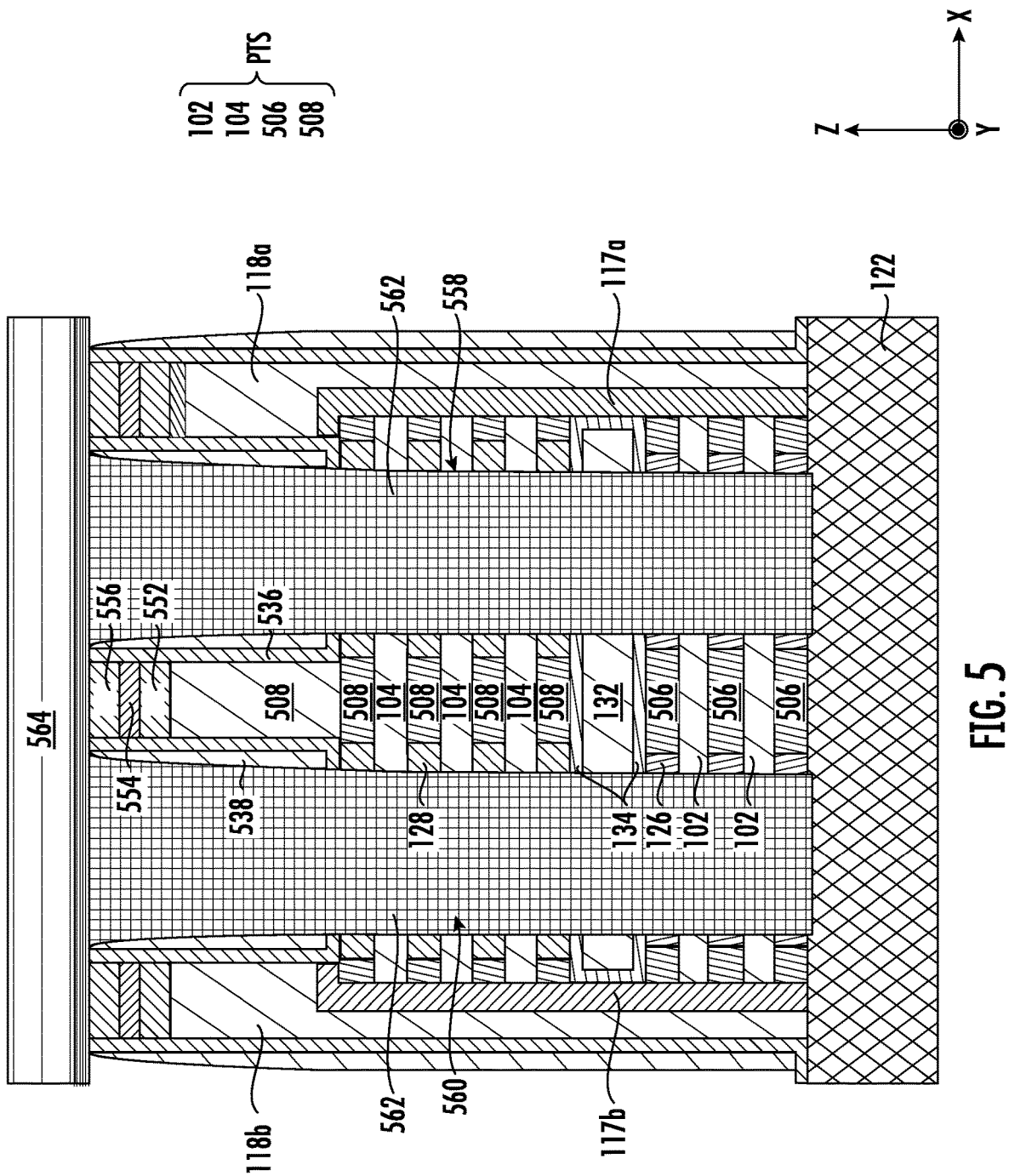
FIGS. 5 through 15 are cross-sectional views illustrating methods of forming an integrated circuit device according to some embodiments.

FIG. 4 is a flow chart of methods of forming a first integrated circuit device 100 according to some embodiments. FIGS. 5 through 15 are cross-sectional views illustrating those methods of forming the first integrated circuit device 100 according to some embodiments. Referring to FIGS. 4 and 5, the methods may include forming a preliminary transistor stack PTS on a substrate 122 (BLOCK 410). The preliminary transistor stack PTS may include an upper channel region 104 and a lower channel region 102 that is between the substrate 122 and the upper channel region 104. The preliminary transistor stack PTS may also include a lower sacrificial layer 506 and an upper sacrificial layer 508 stacked on the lower sacrificial layer 506. The lower and upper sacrificial layers 506 and 508 may include material(s) different from the lower and upper channel regions 102 and 104 such that the lower and upper sacrificial layers 506 and 508 can be selectively removed from the preliminary transistor stack PTS to form lower and upper gate structures (e.g., the lower and upper gate structures 106 and 108 of FIGS. 1 and 1A). For example, the lower and upper sacrificial layers 506 and 508 may include semiconductor material(s) (e.g., silicon germanium).

Lower gate spacers 126 may be formed on sidewalls of the lower sacrificial layer 506, and upper gate spacers 128 may be formed on sidewalls of the upper sacrificial layer 508. In some embodiments, a first gate isolation layer 132 may be formed between the upper sacrificial layer 508 and the lower sacrificial layer 506. A second gate isolation layer 134 may be formed on upper and lower surfaces of the first gate isolation layer 132. According to some embodiments, first and second dummy gate structures 118*a* and 118*b* may be formed on sidewalls of the lower and upper channel regions 102 and 104 and sidewalls of the lower and upper sacrificial layers 506 and 508. A first dummy gate spacer 117*a* may be formed on a sidewall of the first dummy gate structure 118*a*. A second dummy gate spacer 117*b* may be formed on a sidewall of the second dummy gate structure 118*b*.

Preliminary first spacers 536, sacrificial layers 552, 554, and 556 and preliminary second spacers 538 may be formed on the preliminary transistor stack PTS. For example, the sacrificial layers 552, 554, and 556 may be insulating layers. According to some embodiments, the sacrificial layers 552, 554, and 556 may be part of a multi-layer mask. The sacrificial layers 552, 554, and 556, the preliminary first spacers 536, and the preliminary second spacers 538 may comprise, for example, silicon oxide, silicon oxynitride, silicon nitride, or a low-k dielectric material. The sacrificial layers 552, 554, and 556, the preliminary first spacers 536, and the preliminary second spacers 538 may be used as an etch mask while forming the preliminary transistor stack PTS. First and second openings 558 and 560 may be formed on opposing side surfaces of the preliminary transistor stack PTS.

Referring to FIGS. 4 and 5, a preliminary insulating layer 562 (also referred to as a first preliminary insulating layer) may be formed in the first and second openings 558 and 560 (BLOCK 412). The preliminary insulating layer 562 may be formed in the first and second openings 558 and 560 and on sidewalls of the preliminary second spacers 538. For example, the preliminary insulating layer 562 may include the same insulating material as the preliminary second spacers 538 (and/or the same insulating material as the preliminary first spacers 536). The preliminary insulating layer 562 may cover or be on sidewalls of the lower and upper channel regions 102 and 104 and sidewalls of the lower and upper sacrificial layers 506 and 508. A first mask 564 may be formed on the sacrificial layers 552, 554, and 556 and may cover the first and second openings 558 and 560. The preliminary insulating layer 562 may comprise, for example, silicon oxide, silicon oxynitride, silicon nitride, or a low-k dielectric material.

Figure 6:
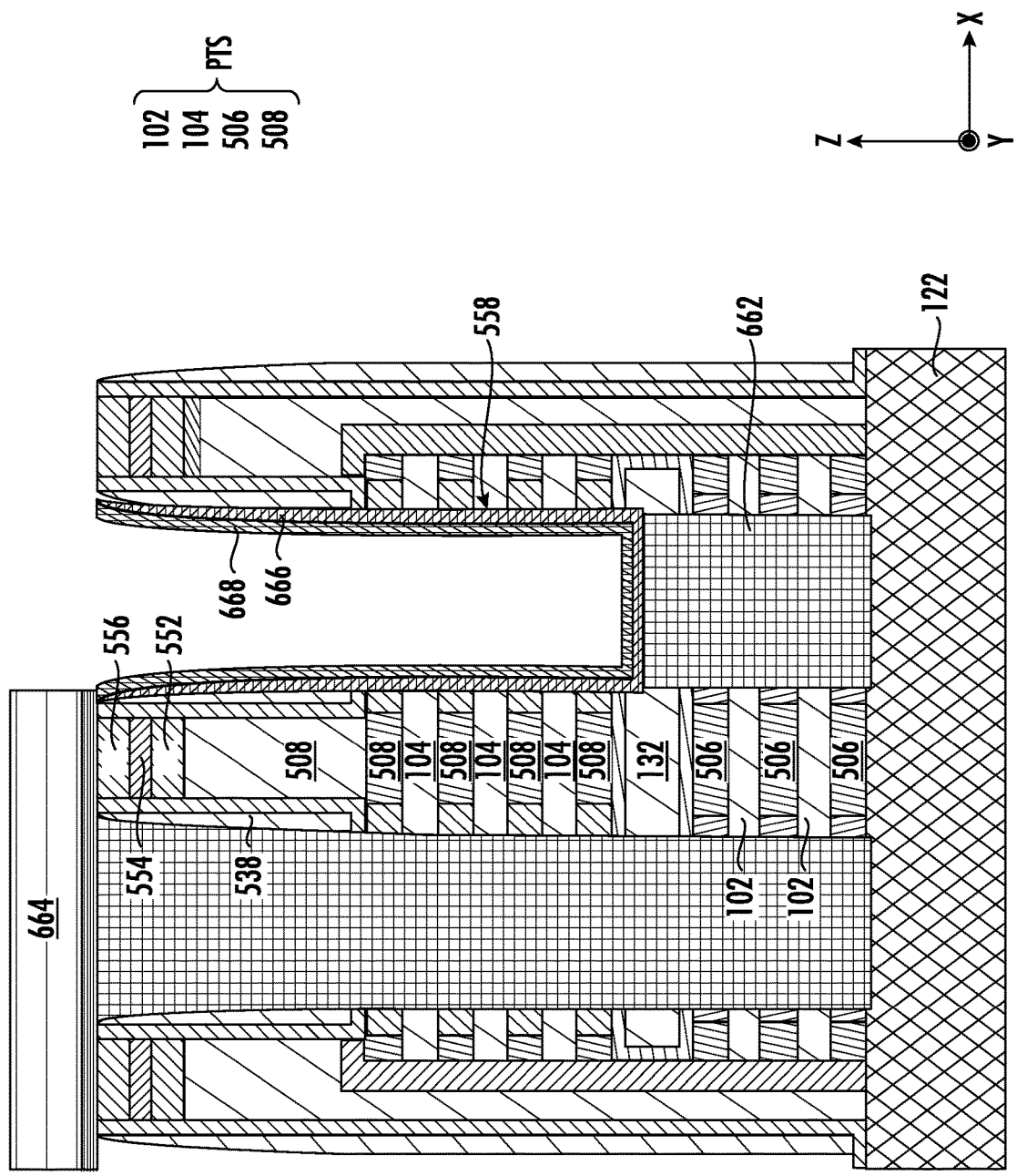

Referring to FIGS. 4 and 6, a portion of the preliminary insulating layer 562 in the first opening 558 may be removed, thereby forming a first lower portion 662 of the preliminary insulating layer 562 (BLOCK 414). For example, a second mask 664 may be formed by removing a portion of the first mask 564 covering the first opening 558 and then an etch process may be performed on the preliminary insulating layer 562 to remove an upper portion thereof in the first opening 558. The second mask 664, the sacrificial layers 552, 554, and 556 and the preliminary second spacers 538 may be used as an etch mask for the etch process. After removing the portion of the preliminary insulating layer 562, an upper surface of the first lower portion 662 of the preliminary insulating layer 562 in the first opening 558 may be coplanar with or higher than an upper surface of an uppermost lower sacrificial layer 506 (e.g., an upper surface of the lower sacrificial layer 506), relative to the substrate 122. A first thin layer 666 and a second thin layer 668 may be formed on sidewalls of the first opening 558, sidewalls of the preliminary second spacers 538, and the upper surface of the first lower portion 662 of the preliminary insulating layer 562 in the first opening 558. For example, the first and second thin layers 666 and 668 may include silicon oxide, silicon oxynitride, silicon nitride, or a low-k dielectric material. In some embodiments, the first and second thin layers 666 and 668 may include different materials. For example, the first thin layer 666 may be a layer that includes an oxide material, and the second thin layer 668 may be a layer that includes a nitride material.

Figure 7:
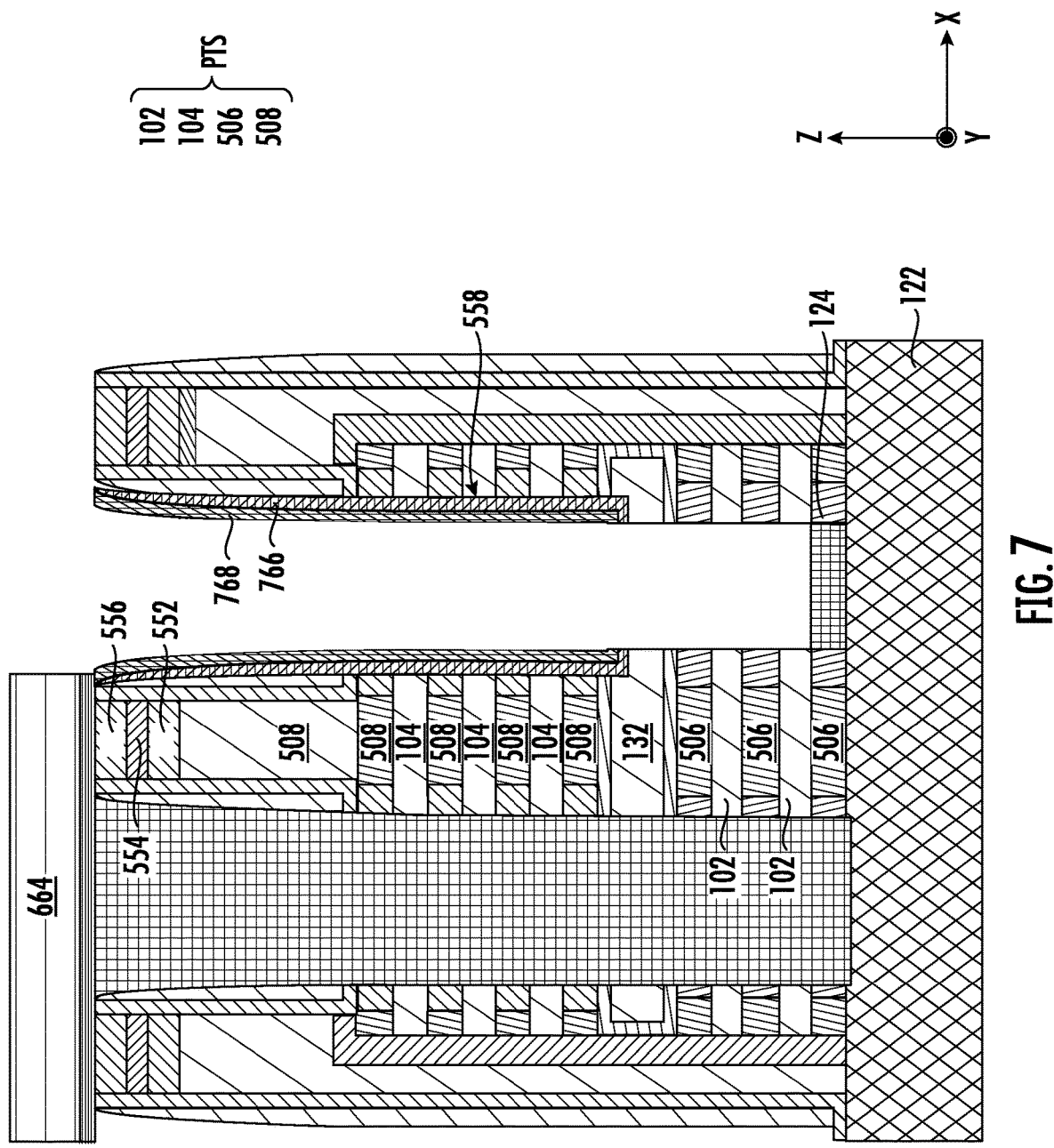

Referring to FIGS. 4 and 7, a first thin spacer 766 and a second thin spacer 768 may be formed by removing portions of the first thin layer 666 and the second thin layer 668 formed on the upper surface of the first lower portion 662 of the preliminary insulating layer 562. Further, a portion of the first lower portion 662 of the preliminary insulating layer 562 in the first opening 558 may be removed to form a bottom insulating layer 124 (BLOCK 416). For example, the second mask 664, the first and second thin spacers 766 and 768 and/or the sacrificial layers 552, 554, and 556 may be used as an etch mask while etching the first lower portion 662 of the preliminary insulating layer 562. The etch process may be performed such that an upper surface of the bottom insulating layer 124 is coplanar with or lower than a lower surface of the lower channel region 102 (e.g., a lower surface of a lowermost lower channel region 102), relative to the substrate 122. The bottom insulating layer 124 may be formed on the substrate 122 and adjacent a first side surface of the lower channel region 102.

Figure 8:
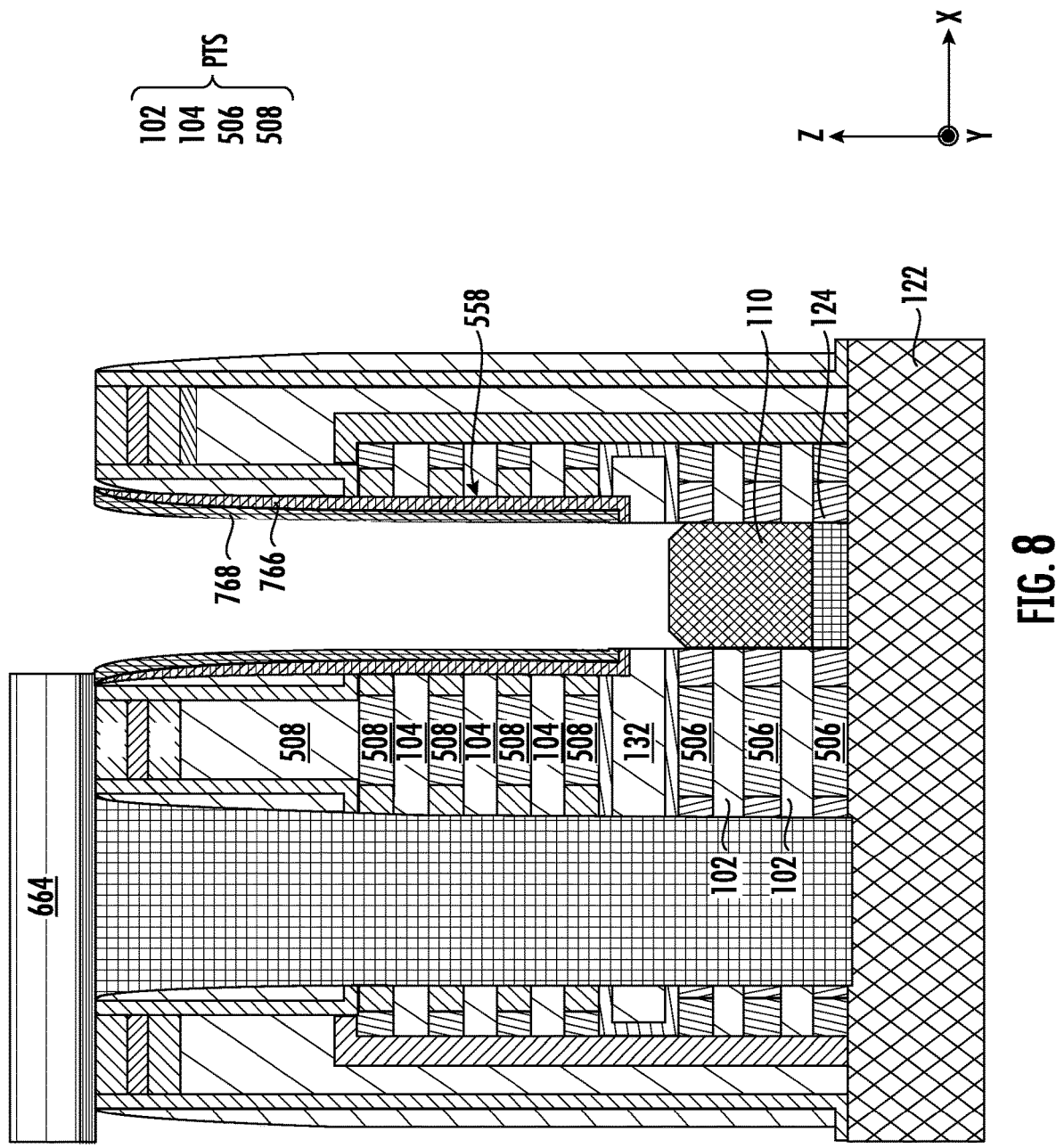

Referring to FIGS. 4 and 8, a first lower source/drain region 110 may be formed (BLOCK 420). The first lower source/drain region 110 may be epitaxially grown from the lower channel region 102 in the first opening 558. In some embodiments, the lower channel region 102 may comprise silicon, and the first lower source/drain region 110 may comprise silicon, silicon carbide, or silicon germanium. However, the present disclosure is not limited thereto and the lower channel region 102 and/or the first lower source/drain region 110 may include one or more semiconductor materials such as Si, Ge, SiGe, GaP, GaAs, SiC, SiGeC and/or InP. The first lower source/drain region 110 may be formed on the bottom insulating layer 124. The first lower source/drain region 110 may contact the first side surface of the lower channel region 102. A lower surface of the first lower source/drain region 110 may be higher than a lower surface of the lower sacrificial layer 506, relative to the substrate 122. Side surfaces of the upper channel region 104 are covered by the first and second thin spacers 766 and 768 while forming the first lower source/drain region 110. Accordingly, an epitaxial layer may not be grown from those side surfaces of the upper channel region 104.

Figure 9:
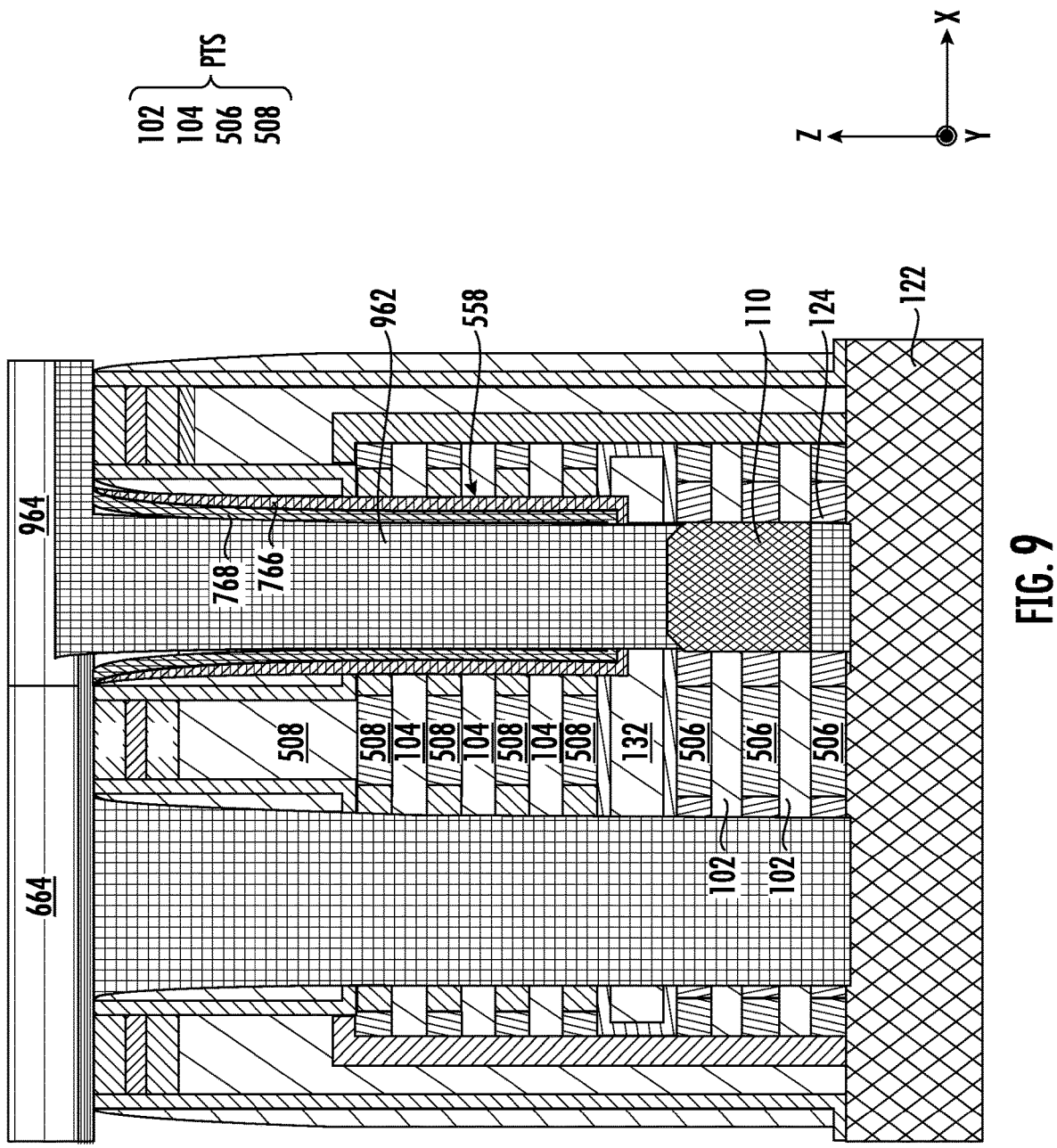

Referring to FIG. 9, after forming the first lower source/drain region 110, a second preliminary insulating layer 962 may be formed in the first opening 558. The second preliminary insulating layer 962 may be formed on side surfaces of the first and second thin spacers 766 and 768 and on an upper surface of the first lower source/drain region 110. A third mask 964 may be formed to cover the second preliminary insulating layer 962.

Figure 10:
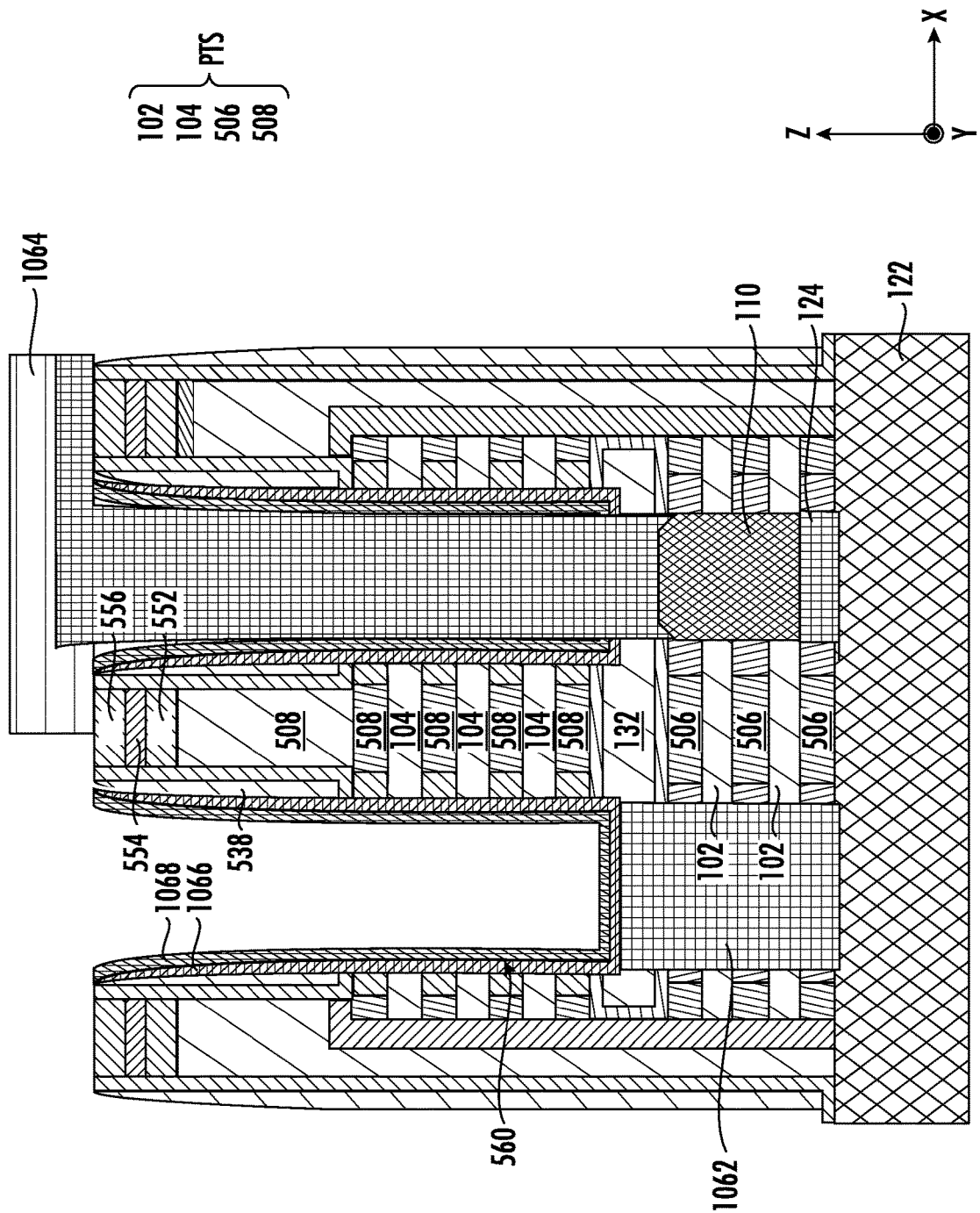

Referring to FIGS. 4 and 10, a portion of the preliminary insulating layer 562 in the second opening 560 may be removed, thereby forming a second lower portion 1062 of the preliminary insulating layer 562 in the second opening 560. (BLOCK 422) For example, a fourth mask 1064 may be formed by removing a portion of the second mask 664 and then an etch process may be performed on the preliminary insulating layer 562 to remove an upper portion thereof in the second opening 560. The fourth mask 1064, the sacrificial layers 552, 554, and 556 and the preliminary second spacers 538 may be used as an etch mask for the etch process. After removing the portion of the preliminary insulating layer 562 in the second opening 560, an upper surface of the second lower portion 1062 of the preliminary insulating layer 562 may be coplanar with or higher than an upper surface of an uppermost lower sacrificial layer 506 (e.g., an upper surface of the lower sacrificial layer 506). A third thin layer 1066 and a fourth thin layer 1068 may be formed on sidewalls of the second opening 560, sidewalls of the preliminary second spacers 538, and the upper surface of the second lower portion 1062 of the preliminary insulating layer 562 in the second opening 560.

Figure 11:
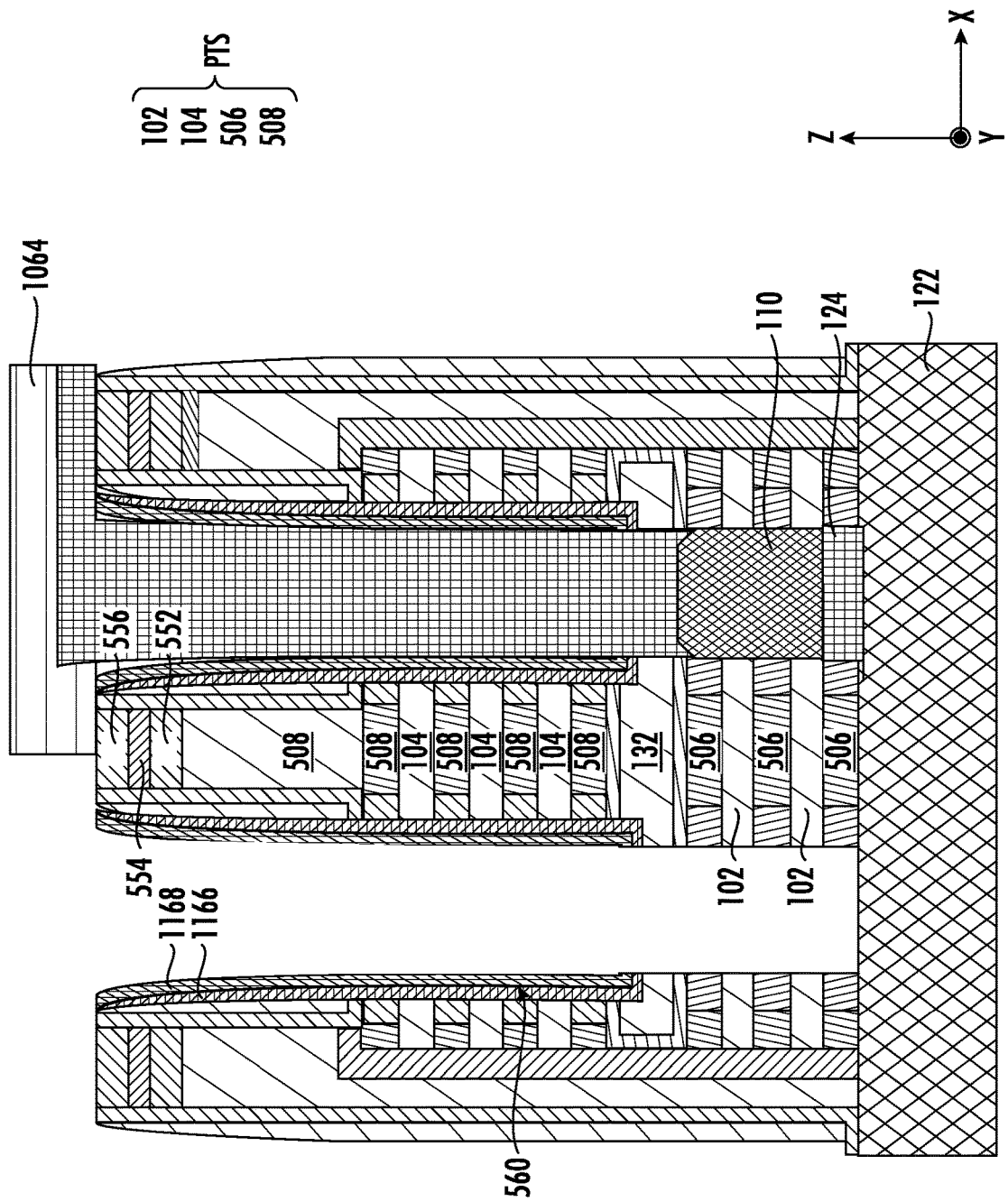

Referring to FIGS. 4 and 11, a third thin spacer 1166 and a fourth thin spacer 1168 may be formed by removing portions of the third thin layer 1066 and the fourth thin layer 1068 formed on the upper surface of the second lower portion 1062 of the preliminary insulating layer 562. Further, the second lower portion 1062 of the preliminary insulating layer 562 in the second opening 560 may be removed (BLOCK 424). For example, an etch process may be performed on the second lower portion 1062 of the preliminary insulating layer 562 using the fourth mask 1064, the third and fourth thin spacers 1166 and 1168, and/or the sacrificial layers 552, 554, and 556 as an etch mask for the etch process.

Figure 12:
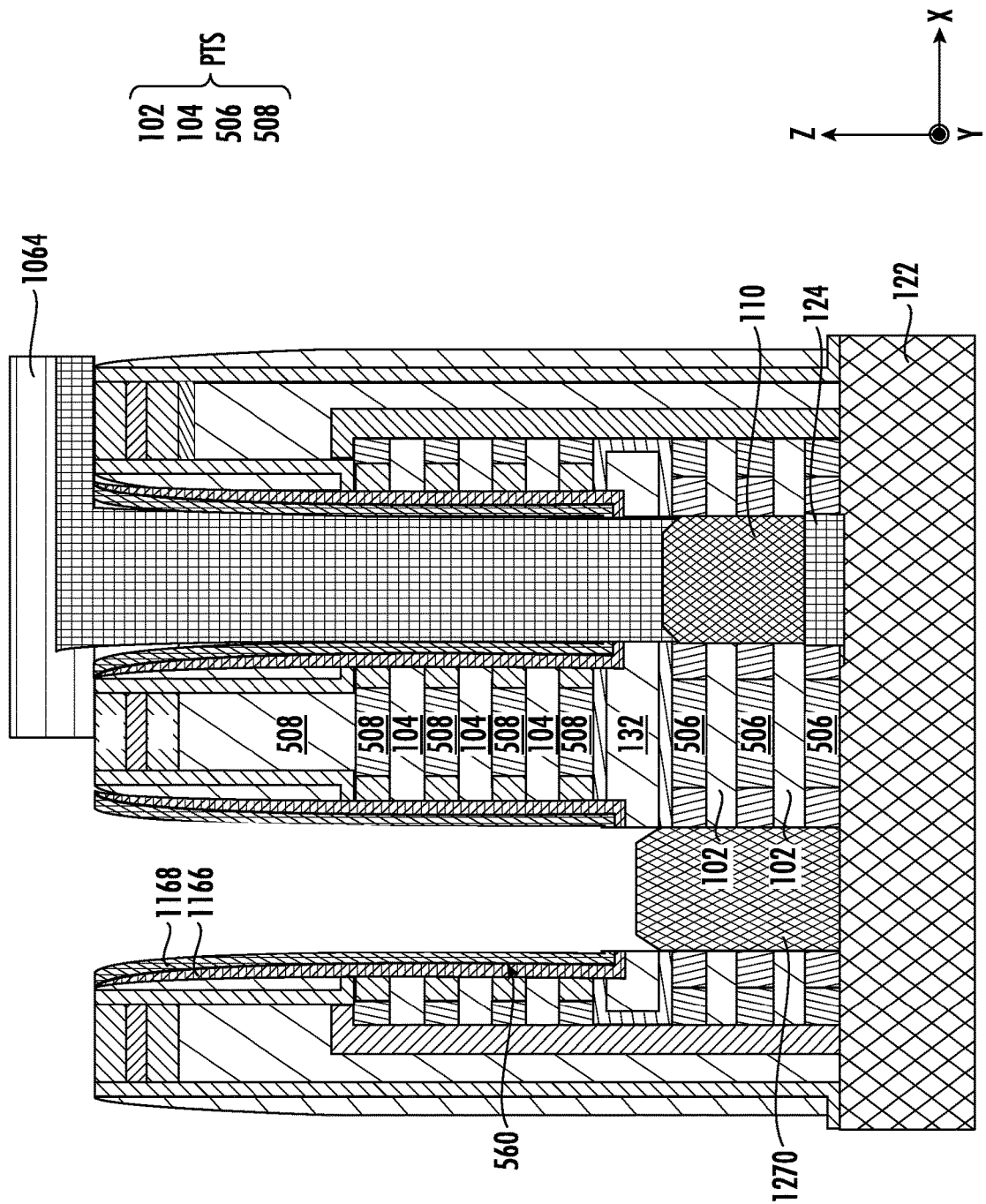

Referring to FIGS. 4 and 12, a preliminary second lower source/drain region 1270 may be formed (BLOCK 426). The preliminary second lower source/drain region 1270 may be epitaxially grown from the lower channel region 102 in the second opening 560. In some embodiments, the lower channel region 102 may comprise silicon, and the preliminary second lower source/drain region 1270 may comprise silicon, silicon carbide, or silicon germanium. However, the present disclosure is not limited thereto and the lower channel region 102 and/or the preliminary second lower source/drain region 1270 may include one or more semiconductor materials such as Si, Ge, SiGe, GaP, GaAs, SiC, SiGeC and/or InP. The preliminary second lower source/drain region 1270 may be formed on the substrate 122 and may contact a second side surface of the lower channel region 102 that is opposite the first side surface of the lower channel region 102. Side surfaces of the upper channel region 104 are covered by the third and fourth thin spacers 1166 and 1168 while forming the preliminary second lower source/drain region 1270. Accordingly, an epitaxial layer may not be grown from those side surfaces of the upper channel region 104.

Figure 13:
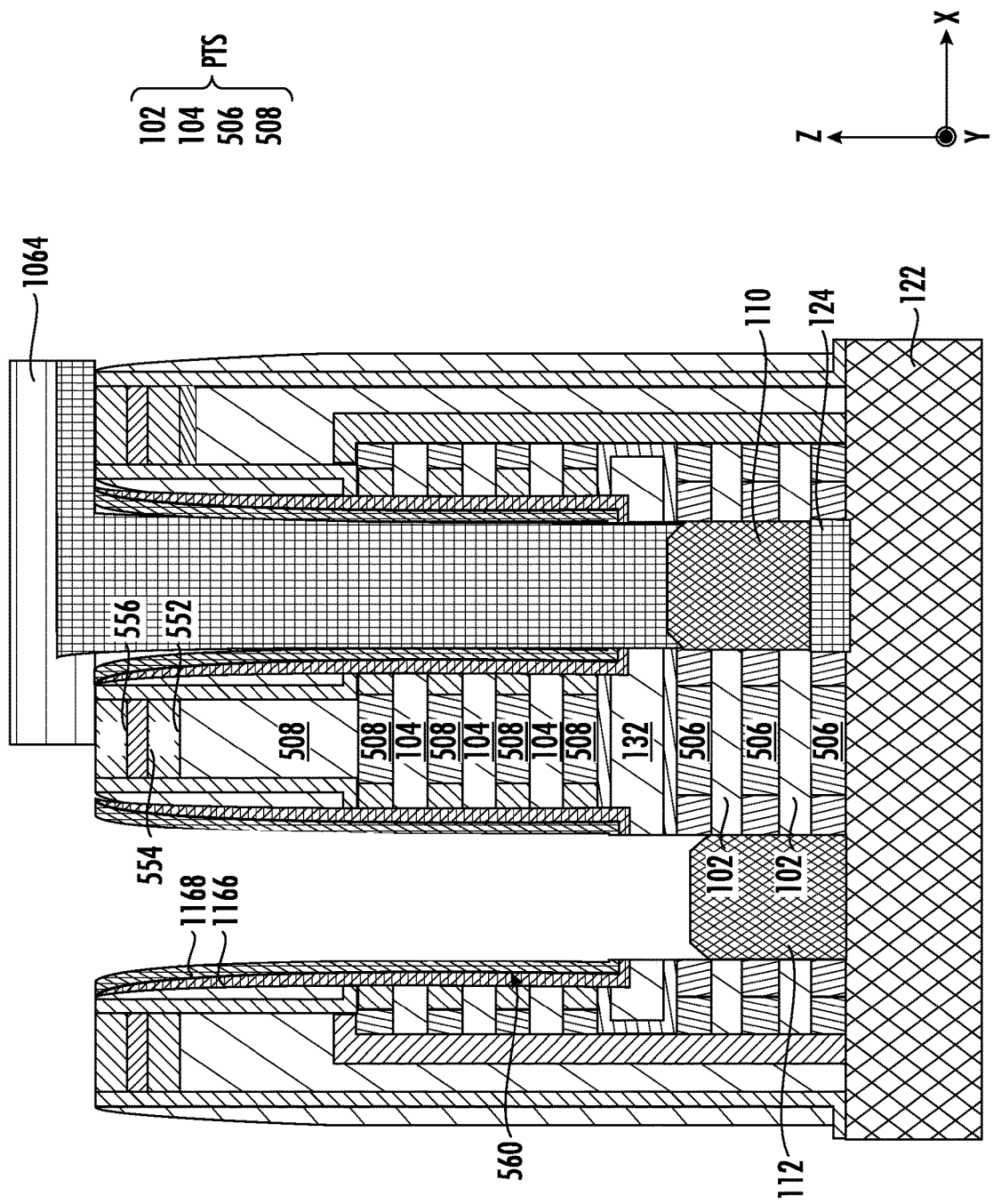

Referring to FIGS. 4 and 13, a second lower source/drain region 112 may be formed (BLOCK 430). The second lower source/drain region 112 may be formed in the second opening 560 by removing an upper portion of the preliminary second lower source/drain region 1270. For example, an etch process may be performed on the preliminary second lower source/drain region 1270 to remove an upper portion thereof. The fourth mask 1064, the third and fourth thin spacers 1166 and 1168, and/or the sacrificial layers 552, 554, and 556 may be used as an etch mask for the etch process. The second lower source/drain region 112 may be formed on the substrate 122 and may contact the second side surface of the lower channel region 102 that is opposite the first side surface of the lower channel region 102. An uppermost end of the second lower source/drain region 112 may be lower than an uppermost end of the first lower source/drain region 110, relative to the substrate 122. In some embodiments, the preliminary second lower source/drain region 1270 may have an upper surface (or an uppermost end) that is lower than an upper surface (or an uppermost end) of an uppermost lower sacrificial layer 506 and thus may be used as the second lower source/drain region 112. Accordingly, the etch process performed for removing the upper portion of the preliminary second lower source/drain region 1270 may be omitted.

Figure 14:
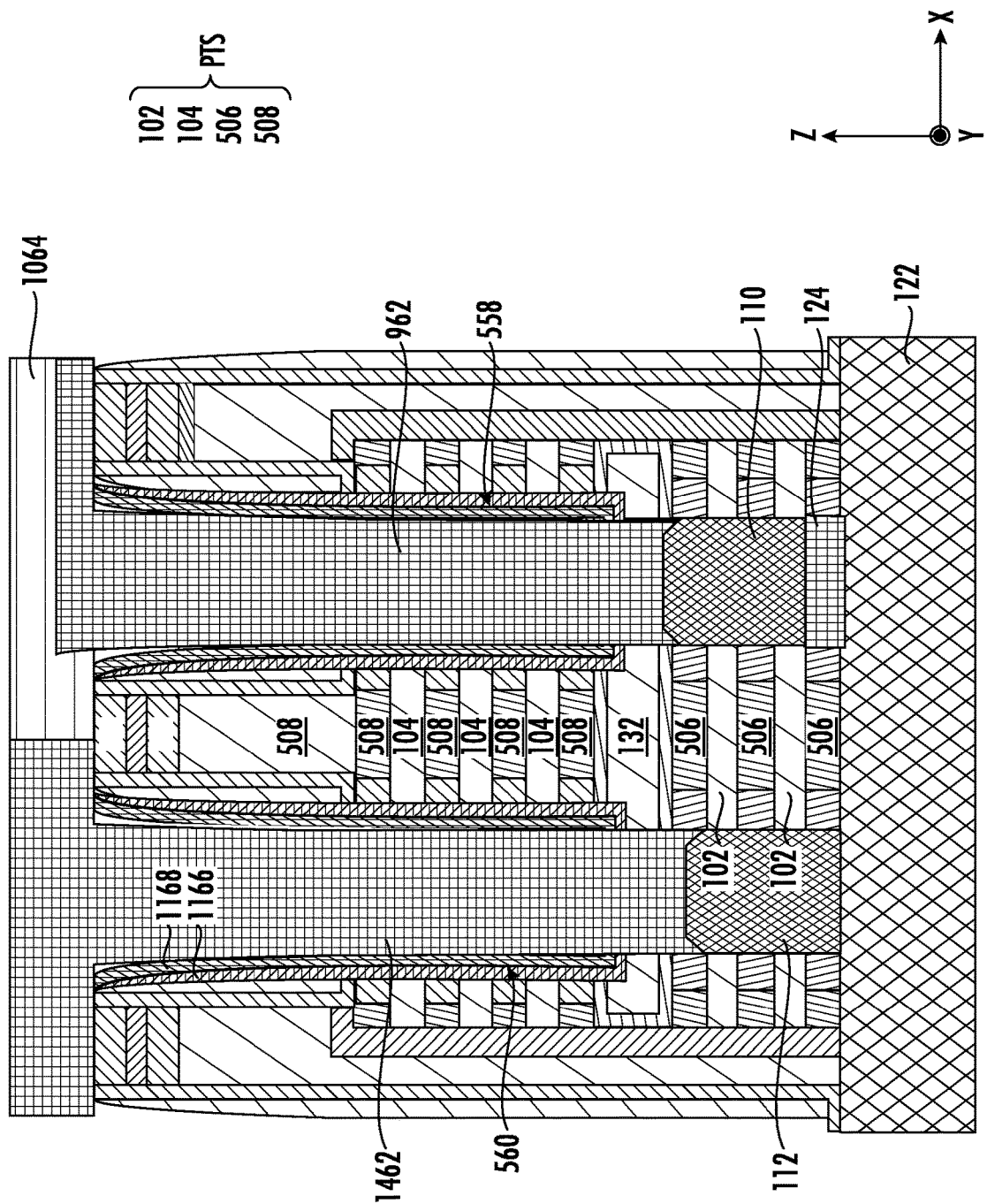

Referring to FIG. 14, after forming the second lower source/drain region 112, a third preliminary insulating layer 1462 may be formed in the second opening 560. The third preliminary insulating layer 1462 may be formed on side surfaces of the third and fourth thin spacers 1166 and 1168 and an upper surface of the second lower source/drain region 112. The fourth mask 1064 may be removed to expose the second preliminary insulating layer 962 formed in the first opening 558.

Figure 15:
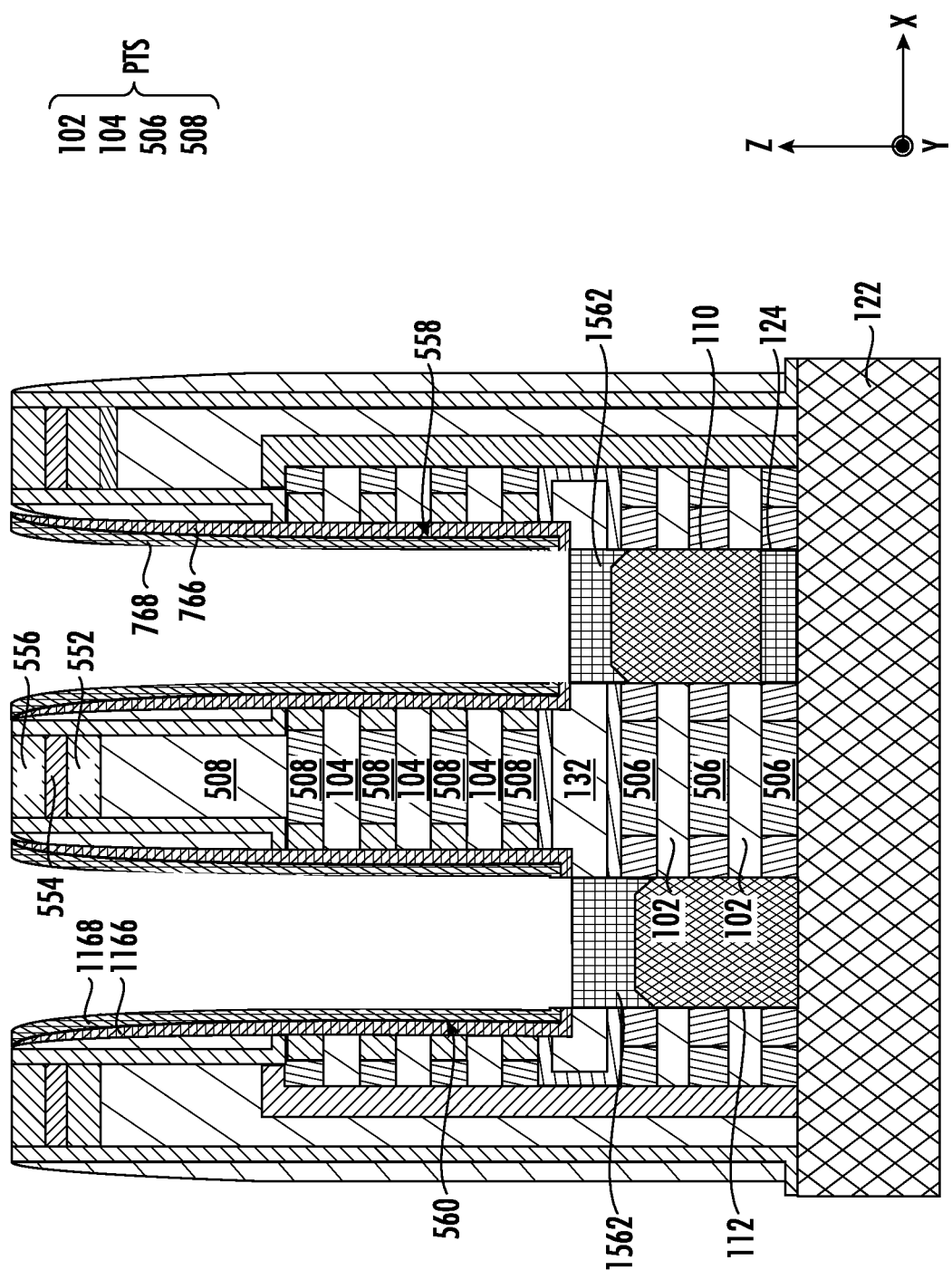

Referring to FIG. 15, a fourth preliminary insulating layer 1562 may be formed on the first and second lower source/drain regions 110 and 112. The fourth preliminary insulating layer 1562 may be formed by removing upper portions of the second and third preliminary insulating layers 962 and 1462. For example, an etch process may be performed on the second and third preliminary insulating layers 962 and 1462. After the fourth preliminary insulating layer 1562 is formed, the first, second, third and fourth thin spacers 766, 768, 1166 and 1168 may be removed to expose side surfaces of the upper channel region 104.

Referring to FIGS. 1A, 1B, 1C and 4, upper source/drain regions (e.g., the first and second upper source/drain regions 114 and 116) may be formed (BLOCK 440). The first and second upper source/drain regions 114 and 116 may be formed on the fourth preliminary insulating layer 1562 (shown in FIG. 15) by performing an epitaxial growth process using the upper channel region 104 as a seed layer. After the first and second upper source/drain regions 114 and 116 are formed, an insulating layer (e.g., the insulating layer 142) may be formed (BLOCK 442). In some embodiments, the insulating layer 142 may be formed on the fourth preliminary insulating layer 1562. The insulating layer 142 and the fourth preliminary insulating layer 1562 may include the same material and may be collectively referred to as an insulating layer. In some other embodiments, the fourth preliminary insulating layer 1562 may be removed and then the insulating layer 142 may be formed.

Upper and lower gate structures (e.g., the upper and lower gate structures 108 and 106) may be formed (BLOCK 450) by replacing the upper and lower sacrificial layers 508 and 506 with the upper and lower gate structures 108 and 106, respectively. After the upper and lower gate structures 108 and 106 are formed, the sacrificial layers 552, 554, and 556 may be removed, and the preliminary first spacers 536 and the preliminary second spacers 538 may be converted to the first spacers 136 and the second spacers 138, respectively.

A top contact (e.g., the top contact 144) may be formed (BLOCK 460). The top contact 144 may be formed in the insulating layer 142 on the first lower source/drain region 110, as shown in FIGS. 1A and 1B. The top contact 144 may be electrically connected to the first lower source/drain region 110.

A back-end-of-line (BEOL) structure (e.g., the BEOL structure 146) may be formed (BLOCK 470). The top contact 144 may electrically connect the first lower source/drain region 110 to a conductive element (e.g., a conductive wire or a conductive via plug) of the BEOL structure 146 that is formed through the BEOL portion of device fabrication, as shown in FIGS. 1A and 1B.

A bottom contact (e.g., the bottom contact 148) may be formed (BLOCK 480). The bottom contact 148 may be formed in the substrate 122, as shown in FIGS. 1A and 1C. For example, an etch process may be performed on a lower surface of the substrate 122 to form an opening in the substrate 122, and the bottom contact 148 may be formed in the opening formed in the substrate 122. In some embodiments, before forming the bottom contact 148, a process (e.g., a grinding process and/or an etch process) may be performed on the lower surface of the substrate 122 to reduce a thickness of the substrate 122.

A backside power distribution network (BSPDN) structure (e.g., the BSPDN structure 150) may be formed (BLOCK 490). The BSPDN structure 150 may be formed on the lower surface of the substrate 122, as shown in FIGS. 1A, 1B, and 1C. In some embodiments, the BSPDN structure 150 may contact the bottom contact 148.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing. Although an element is illustrated as a single layer in the drawings, that element may include multiple layers.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

What is claimed is:
1. An integrated circuit device comprising:
a substrate; and
a transistor stack on the substrate, the transistor stack comprising a first transistor and a second transistor on the first transistor, wherein the first transistor is between the substrate and the second transistor and wherein the first transistor comprises:
first and second source/drain regions;
a first channel region between the first and second source/drain regions; and
a first gate structure on the first channel region,
wherein a lower surface of the first source/drain region is higher than a lower surface of the first gate structure relative to the substrate, and
wherein the lower surface of the first source/drain region is higher than a lower surface of the second source/drain region relative to the substrate.

2. The integrated circuit device of claim 1, further comprising a bottom insulating layer between the lower surface of the first source/drain region and the substrate.

3. The integrated circuit device of claim 2, wherein an upper surface of the bottom insulating layer contacts the lower surface of the first source/drain region.

4. The integrated circuit device of claim 2, wherein the lower surface of the first gate structure is coplanar with a lower surface of the bottom insulating layer.

5. The integrated circuit device of claim 1, further comprising a top contact contacting an upper surface of the first source/drain region.

6. The integrated circuit device of claim 1, wherein the substrate and the second transistor are spaced apart from each other in a direction,
the first channel region comprises a plurality of first channel regions stacked in the direction, and
the lower surface of the first source/drain region is coplanar with a lower surface of a lowermost first channel region of the plurality of first channel regions.

7. The integrated circuit device of claim 1, wherein the substrate and the second transistor are spaced apart from each other in a direction,
the first channel region comprises a plurality of first channel regions stacked in the direction, and
a lower portion of the first gate structure is between the substrate and a lowermost first channel region of the plurality of first channel regions.

8. The integrated circuit device of claim 1, wherein the lower surface of the second source/drain region is higher than the lower surface of the first gate structure relative to the substrate.

9. The integrated circuit device of claim 8, further comprising:
a first bottom insulating layer between the lower surface of the first source/drain region and the substrate; and
a second bottom insulating layer between the lower surface of the second source/drain region and the substrate.

10. The integrated circuit device of claim 8, further comprising:
a first top contact contacting an upper surface of the first source/drain region; and
a second top contact contacting an upper surface of the second source/drain region.

11. The integrated circuit device of claim 1, further comprising a bottom contact in the substrate and electrically connected to the second source/drain region.

12. An integrated circuit device comprising:
a substrate; and
a transistor stack on the substrate, the transistor stack comprising a first transistor and a second transistor on the first transistor,
wherein the first transistor is between the substrate and the second transistor and comprises:
first and second source/drain regions;
a first channel region between the first and second source/drain regions; and
a first gate structure on the first channel region and between the first and second source/drain regions,
wherein an uppermost end of the second source/drain region is spaced apart from the substrate by a first distance, and an upper surface of the first gate structure is spaced apart from the substrate by a second distance that is greater than the first distance.

13. The integrated circuit device of claim 12, wherein an uppermost end of the first source/drain region is spaced apart from the substrate by a third distance that is greater than the first distance.

14. The integrated circuit device of claim 12, wherein the substrate and the second transistor are spaced apart from each other in a direction,
the first channel region comprises a plurality of first channel regions stacked in the direction, and
a lowermost end of the upper surface of the second source/drain region is spaced apart from the substrate by a fourth distance, and an upper surface of an uppermost first channel region of the plurality of first channel regions is spaced apart from the substrate by a fifth distance that is equal to the fourth distance.

15. The integrated circuit device of claim 12, further comprising a bottom contact in the substrate and electrically connected to the second source/drain region.

16. A method of forming an integrated circuit device, the method comprising:
forming a preliminary transistor stack on a substrate, the preliminary transistor stack comprising an upper channel region and a lower channel region that is between the substrate and the upper channel region;
forming a bottom insulating layer on the substrate and adjacent a first side surface of the lower channel region;
forming a first source/drain region on the bottom insulating layer, the first source/drain region contacting the first side surface of the lower channel region; and
forming a second source/drain region that is on the substrate and contacts a second side surface of the lower channel region,
wherein an uppermost end of the second source/drain region is lower than an uppermost end of the first source/drain region relative to the substrate.

17. The method of claim 16, further comprising:
forming an insulating layer on the first source/drain region; and
forming a top contact in the insulating layer, wherein the top contact is electrically connected to the first source/drain region.

18. The method of claim 16,
wherein the first side surface of the lower channel region is opposite the second side surface of the lower channel region.

19. The method of claim 18, wherein forming the second source/drain region comprises:
forming a preliminary second source/drain region that is on the substrate and contacts the second side surface the of the lower channel region; and
forming the second source/drain region by removing an upper portion of the preliminary second source/drain region.

* * * * *